(12) United States Patent
Maeda

(10) Patent No.: US 7,902,721 B2
(45) Date of Patent: Mar. 8, 2011

(54) CRYSTAL RESONATOR

(75) Inventor: Hiroshi Maeda, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 325 days.

(21) Appl. No.: 11/991,353

(22) PCT Filed: Sep. 14, 2006

(86) PCT No.: PCT/JP2006/318286
§ 371 (c)(1),
(2), (4) Date: Mar. 3, 2008

(87) PCT Pub. No.: WO2007/032444
PCT Pub. Date: Mar. 22, 2007

(65) Prior Publication Data
US 2009/0085428 A1    Apr. 2, 2009

(30) Foreign Application Priority Data

Sep. 15, 2005  (JP) ................. 2005-267732
Mar. 29, 2006  (JP) ................. 2006-091885

(51) Int. Cl.
*H01L 41/047* (2006.01)
*H01L 41/09* (2006.01)
(52) U.S. Cl. .......... 310/320; 310/312; 310/333; 310/365
(58) Field of Classification Search ............... 310/312, 310/320, 333, 365
See application file for complete search history.

(56) References Cited

U.S. PATENT DOCUMENTS

| | | | | |
|---|---|---|---|---|
| 3,076,903 A | * | 2/1963 | Schwartz | 310/330 |
| 4,641,055 A | * | 2/1987 | Tanaka | 310/368 |
| 5,117,147 A | * | 5/1992 | Yoshida | 310/320 |
| 5,903,087 A | * | 5/1999 | Mattson et al. | 310/365 |
| 6,236,140 B1 | | 5/2001 | Arimura | |
| 6,469,423 B2 | * | 10/2002 | Nagai | 310/361 |
| 6,750,593 B2 | * | 6/2004 | Iwata | 310/321 |
| 2004/0130241 A1 | * | 7/2004 | Iwata | 310/320 |

FOREIGN PATENT DOCUMENTS

| | | | |
|---|---|---|---|
| JP | 58-6616 | * | 1/1983 |
| JP | 59-128808 | * | 7/1984 |
| JP | 62-118627 | | 5/1987 |
| JP | 4-255105 | * | 9/1992 |
| JP | 04-276915 | * | 10/1992 |
| JP | 10-098351 | | 4/1998 |
| JP | 2001-196890 | | 7/2001 |
| JP | 2004-153596 | * | 5/2004 |
| JP | 2005-341429 | * | 12/2005 |
| JP | 2008-5333 | * | 1/2008 |

OTHER PUBLICATIONS

International Search Report mailed Nov. 28, 2006 for International Application No. PCT/JP2006/318286.

* cited by examiner

*Primary Examiner* — Thomas M Dougherty
(74) *Attorney, Agent, or Firm* — Marvin A. Motsenbocker; Mots Law, PLLC

(57) ABSTRACT

A crystal resonator comprises an AT-cut crystal vibrating element that is driven by a thickness-shear mode and is in the shape of a rectangular plate. A pair of excitation electrodes is formed, facing front and rear surfaces of the crystal vibrating element. Each of the excitation electrodes is formed in the shape of a quadrangle as viewed from the top, and mass adjustment portions are formed at least two opposite sides of each of the excitation electrodes formed on the front and rear surfaces.

20 Claims, 19 Drawing Sheets

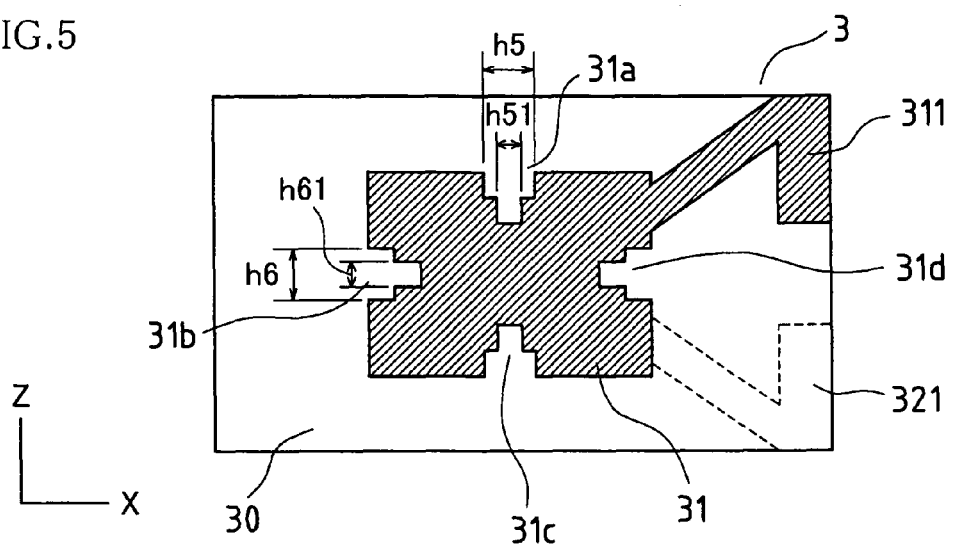
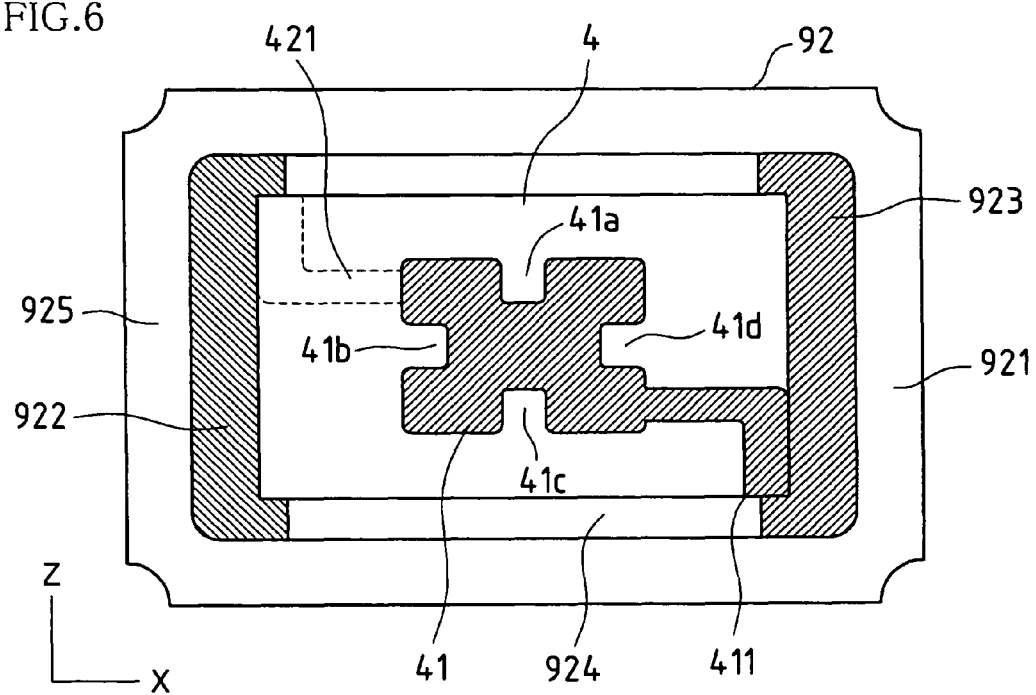

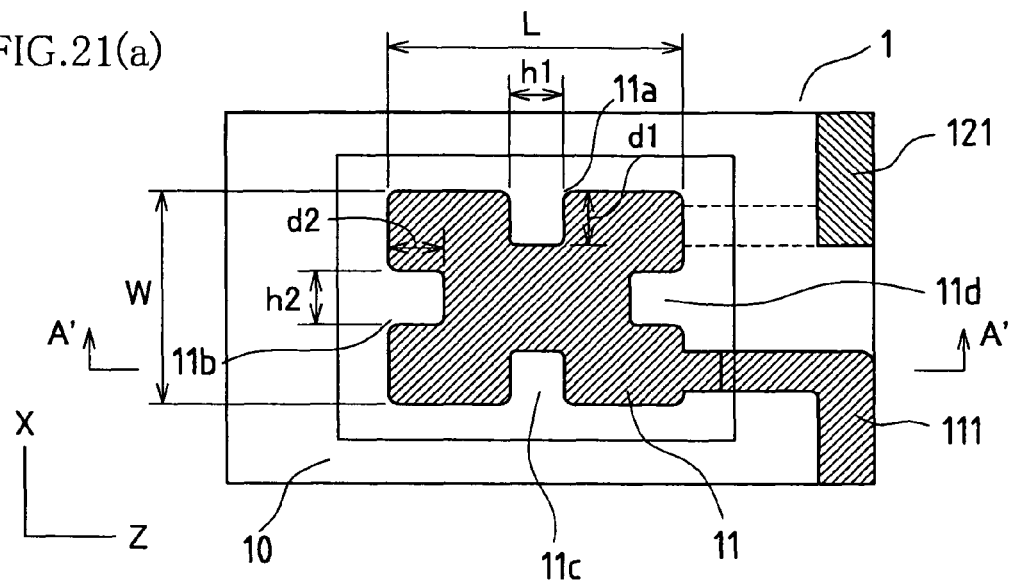
FIG.21(a)
FIG.21(b)
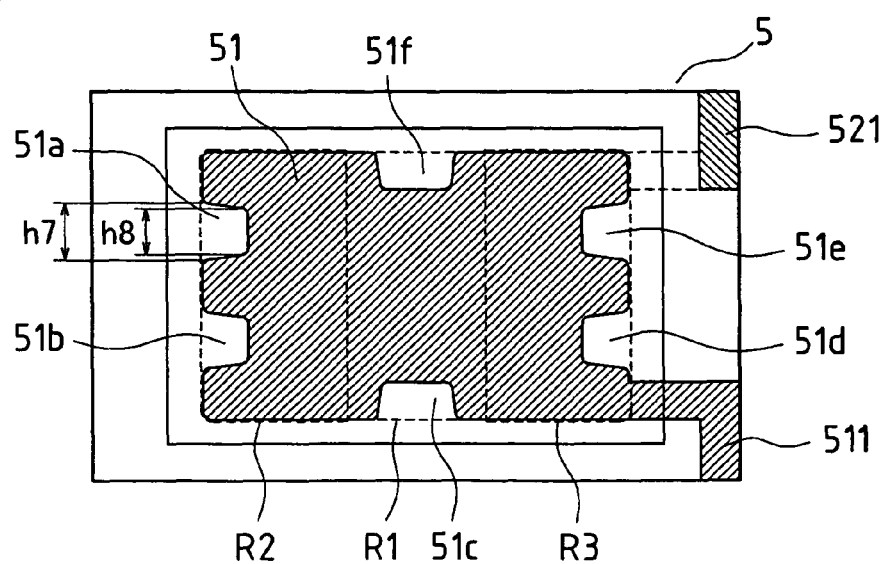
FIG.22

CRYSTAL RESONATOR

TECHNICAL FIELD

The present invention relates to a high-frequency crystal resonator for use in electronic apparatuses.

BACKGROUND ART

A thickness vibration mode crystal resonator employing an AT-cut crystal vibrating element generally has an arrangement in which a pair of excitation electrodes is formed on front and rear surfaces of the crystal vibrating element, the excitation electrodes being exactly opposed to each other, and an alternating current is applied to the excitation electrodes. Various characteristics of such a piezoelectric resonator depend on the arrangement of the excitation electrodes. For example, when an electrode having a large size is used, the area of excitation can be increased, a series resonance resistance can be improved, and a frequency pulling range can be broadened.

Various characteristics of the crystal resonator also largely depend on the arrangement of the crystal vibrating element (crystal plate). For example, the plate surfaces of the crystal vibrating element may not be uniformly parallel to each other (not uniform plane parallelism) due to production conditions or production variations. In such a case, a spurious vibration is strongly excited, resulting in a deterioration in characteristics of the crystal resonator. Such a problem may be significant in a voltage control piezoelectric oscillator, which pulls a main vibration frequency by varying an external voltage, when the frequency is significantly pulled. Specifically, when the main vibration frequency is pulled, coupling with the spurious vibration is highly likely to occur, so that, disadvantageously, a frequency jump phenomenon occurs or oscillation is unstable.

FIG. 23 is a plan view showing a conventional surface mount crystal resonator before being hermetically enclosed. In FIG. 23, a crystal vibrating element 103 on which excitation electrodes 101 and 102 are formed is mounted in a package 10. In such an arrangement, when there is a variation in thickness of the crystal vibrating element, so that the plane parallelism is not perfect, a spurious vibration occurs.

FIGS. 24 and 25 are diagrams showing a state in which a spurious vibration is excited due to the plane parallelism of the plate thickness. FIG. 24(a) is a schematic cross-sectional view showing a state in which the excitation electrodes 101 and 102 are formed on an AT-cut crystal plate 7, where the plate thicknesses t1=t2, i.e., the plane parallelism of the plate surfaces is perfect. In such a crystal plate; frequency characteristics in which a spurious vibration does not appear in the vicinity of the main vibration are obtained as shown in FIG. 24(b). In FIGS. 24(b) and 25(b), the vertical axis represents impedances (Z) and the horizontal axis represents frequencies (FREQUENCY).

FIG. 25(a) is also a schematic cross-sectional view showing a state in which excitation electrodes 101 and 102 are provided on a crystal plate 7, where the plate thicknesses t1<t2, i.e., the plane parallelism of the plate surfaces is not perfect. In such a crystal plate, resonance characteristics in which spurious vibrations Sp appear in the vicinity of the main vibration are obtained as shown in FIG. 25(b). It is considered that such spurious vibrations Sp occur due to the imperfect plane parallelism of the plate surfaces. Specifically, it is known that, in a thickness-shear mode, the fs mode (symmetric mode) and the fa mode (oblique symmetric mode) are excited. In the oblique symmetric mode, vibration energy is canceled as a whole, so that the spurious vibration typically does not become manifest as a resonance peak. However, it is considered that, when vibration balance collapses due to the imbalance of the crystal plate, the mode becomes manifest as a spurious vibration.

Such a deterioration in characteristics of the crystal plate due to a variation in the plane parallelism, is disclosed in, for example, Patent Document 1 described below. In Patent Document 1, one of the opposed electrodes (excitation electrodes) is composed of two split electrodes. The split electrodes are caused to have substantially the same resonance frequency between the split electrodes and the other one of the opposed electrodes, thereby improving the characteristics. The split electrodes are electrically connected via a conductive means. In order to cause the split electrodes to have substantially the same resonance frequency, frequency adjustment is performed by, for example, subjecting either of the electrodes to vapor deposition or the like.

However, for the resonance frequency adjustment, either of the split electrodes is generally adjusted, but a step of determining a split electrode to be adjusted is required so as to adjust the vibration balance.

Also, in order to form such split electrodes, it is necessary to prepare a package having electrode pads that are electrically and mechanically connected separately to the respective electrodes of the crystal plate. Further, for example, it is necessary to form a wiring pattern commonly connected to the separate electrode pads, on a mount substrate, after frequency adjustment. Thus, it is troublesome to handle such an arrangement.

Further, the problem with the plane parallelism becomes manifest when the frequency is high. It is well known that the frequency of the AT-cut crystal plate, which is driven by a thickness vibration (e.g., a thickness-shear mode) is determined based on the thickness of the crystal plate, and the frequency is inversely proportional to the thickness. The deviation of the frequency per unit thickness increases with an increase in the frequency, so that the frequency adjustment of the crystal plate surface becomes more important.

For example, in the AT-cut crystal vibrating element, assuming that the fundamental frequency is 60 MHz, when the thickness is changed by 0.012 μm, the frequency deviation is 25 KHz. Assuming that the fundamental frequency is two times as high, i.e., 120 MHz, even when the thickness is similarly changed by 0.012 μm, the frequency deviation is four times as high, i.e., 100 KHz. As the frequency is further increased, the frequency deviation per unit thickness is increased.

Note that an arrangement in which the shape of the excitation electrode is varied is disclosed in Patent Document 2 described below, though the problem with the plane parallelism is not mentioned. Patent Document 2 discloses a crystal filter having an arrangement in which an input electrode and an output electrode are formed on one of the principal surfaces of a crystal plate and adjacent to each other with a predetermined interval, and a common electrode corresponding to the input and output electrodes is formed on the other principal surface. Basically, an arrangement that suppresses a non-harmonic overtone mode is disclosed.

Patent Document 1: JP 2001-196890 A
Patent Document 2: JP 10-98351 A

DISCLOSURE OF INVENTION

Problem to be Solved by the Invention

The present invention is provided in view of the above-described problems. An object of the present invention is to provide a practical crystal resonator having satisfactory characteristics, in which various spurious vibrations are suppressed even when the crystal resonator is adapted to provide a high frequency.

Means for Solving Problem

To achieve the object, the present inventor diligently studied the relationship between the shapes of the excitation electrodes formed on the front and rear surfaces of the crystal vibrating element and spurious characteristics, and as a result, achieved a crystal resonator that does not suffer from an influence of a spurious vibration even when it is adapted to provide a high frequency. The crystal resonator has the following arrangement.

Specifically, to achieve the object, the crystal resonator of the present invention is a crystal vibrating element that is driven by a thickness-shear mode, in which a pair of excitation electrodes is formed, facing a front surface and a rear surface of the crystal vibrating element, each of the excitation electrodes is in the shape of a quadrangle as viewed from the top, and mass adjustment portions are formed at least two opposite sides of each of the excitation electrodes formed on the front and rear surfaces.

According to the present invention, the pair of excitation electrodes are formed, facing the front and rear surfaces of the crystal vibrating element, each of the excitation electrodes is in the shape of a quadrangle as viewed from the top, and the mass adjustment portions are formed at at least two opposite sides of each of the excitation electrodes formed on the front and rear surfaces. Therefore, it is possible to achieve a practical crystal resonator having satisfactory characteristics, in which various spurious vibrations are suppressed even when the crystal resonator is adapted to provide a high frequency. In other words, in the present invention, it is possible to suppress a spurious vibration excited due to a variation in the plane parallelism of the crystal plate and thereby obtain a crystal resonator having satisfactory characteristics even when the crystal resonator is adapted to provide a high frequency.

Also, in the arrangement, each of the excitation electrodes may be formed in the shape of a rectangle as viewed from the top, and a mass adjustment portions may be formed in each of middle regions of at least two opposite sides of each of the excitation electrodes formed on the front and rear surfaces.

In such an arrangement, it is possible to avoid the influence of a spurious vibration in a crystal vibrating element whose thickness uniformly varies in the vicinity of each of the two opposite sides. For example, in such an arrangement, a frequency difference occurs due to a difference in thickness in the vicinity of each of the two opposite sides, so that a spurious vibration (hereinafter referred to as a secondary mode spurious vibration) due to the frequency imbalance of the fa mode (oblique symmetric mode) becomes manifest. According to the present invention, by providing the mass adjustment portion as described above, the level of the secondary mode spurious vibration is reduced, so that the secondary mode spurious vibration is shifted toward a higher frequency and away from the vicinity of the main vibration, and therefore, substantially does not have an adverse influence. In other words, according to the present invention, it is possible to provide a practical crystal resonator having satisfactory characteristics, in which the secondary mode spurious vibration based on the fa mode are suppressed even when the crystal resonator is adapted to provide a high frequency.

Also, in the arrangement, each of the excitation electrodes is formed in the shape of a rectangle as viewed from the top, and a mass adjustment portion may be formed in a middle region of each side of each of the excitation electrodes formed on the front and rear surfaces. Note that pairs of the mass adjustment portions at the longer sides and the shorter sides may each have the same shape and size, or may each have different sizes, depending on the level of occurrence of the secondary mode spurious vibration.

In such an arrangement, even when a crystal vibrating element has different thicknesses in the regions at the sides of the excitation electrode, and the secondary mode spurious vibration becomes manifest due to such a difference in thickness, it is possible to avoid the influence of the spurious vibration using the mass adjustment portion. Specifically, even when a frequency difference occurs due to a difference in thickness of the crystal plate, so that the secondary mode spurious vibration occurs lengthwise and widthwise in the excitation electrode portion due to the frequency imbalance of the oblique symmetric mode (fa mode), the level of the spurious vibration is reduced, and the mass adjustment portion shifts the spurious vibration toward a higher frequency, so that the spurious vibration does not have an adverse influence on the main vibration.

Also, in the arrangement, each of the excitation electrodes may be formed in the shape of a rectangle as viewed from the top, and a mass adjustment portion may be formed in each of regions obtained by dividing at least two opposite sides of each of the excitation electrodes formed on the front and rear surfaces into three equal parts.

In such an arrangement, by virtually dividing the two opposite sides into substantially three equal parts, the excitation electrodes are each divided into a middle region and one lateral region and the other lateral region provided on both sides of the middle region, and the excitation electrodes are provided, facing the front and rear surfaces of the crystal resonator. Mass adjustment portions are formed at the opposed sides in the regions of the excitation electrodes on both the front and rear surfaces. In the arrangement, a harmonic spurious vibration in $(Y, X, Z)=(1, 3, 1)$ mode, $(Y, X, Z)=(1, 1, 3)$ mode or the like in a frequency region slightly higher than the main vibration, which is conventionally likely to become manifest, is suppressed, thereby making it possible to suppress an adverse influence on the main vibration. Note that the main vibration is less affected by the mass adjustment portion as compared to the harmonic spurious vibration, since vibration energy is concentrated into the middle region of the excitation electrode. Therefore, practical characteristics can be obtained without the main vibration frequency being attenuated.

Also, in the arrangement, the two opposite sides may be the longer sides.

In such an arrangement, by virtually dividing the opposite longer sides into substantially three equal parts, the excitation electrode can be divided into a middle region and one lateral region and the other lateral region, and the excitation electrodes are provided, facing the front and rear surfaces of the crystal resonator. Mass adjustment portions are formed at the opposed sides in the regions of the excitation electrodes on either or both of the front and rear surfaces. In the arrangement, harmonic spurious vibration in $(Y, X, Z)=(1, 3, 1)$ mode, $(Y, X, Z)=(1, 1, 3)$ mode or the like in a frequency region slightly higher than the main vibration, which is conventionally likely to become manifest, is suppressed, thereby making it possible to suppress an adverse influence on the main vibration. Note that the main vibration is less affected by the mass adjustment portion as compared to the harmonic spurious vibration, since vibration energy is concentrated into the middle region of the excitation electrode. Therefore, practical characteristics can be obtained without the main vibration frequency being attenuated.

Also, in the arrangement, at least one mass adjustment portion may be formed at a shorter side of at least one of the excitation electrodes formed on the front and rear surfaces.

In this case, by additionally forming a mass adjustment portion at a shorter side, the vibration energy of a spurious vibration present in the shorter side region is reduced, which can efficiently suppress the harmonic spurious vibration in combination with the spurious suppressing effect of the mass adjustment portion formed at the longer side. Note that a mass adjustment portion may be formed in a middle region of the shorter side, or both lateral regions slightly shifted outward from the middle region.

Also, in the arrangement, each of the excitation electrodes is formed in the shape of a rectangle as viewed from the top, and mass adjustment portions are formed at least two opposite sides of each of the excitation electrodes formed on the front and rear surfaces. While a mass adjustment portion is formed in the middle region of each longer side of one of the excitation electrodes, mass adjustment portions are formed in the regions shifted from the middle toward both sides of the other excitation electrode (i.e., the excitation electrodes have different shapes). At each shorter side of each of the excitation electrodes, mass adjustment portions may be provided between the middle region and both ends thereof.

In this case, while a mass adjustment portion is formed in the middle region of each longer side of one of the excitation electrodes formed on the front and rear surfaces, mass adjustment portions are formed in the regions shifted from the middle toward both sides of the other excitation electrode (i.e., the excitation electrodes have different shapes). The shorter sides of each excitation electrode have the same shape in which mass adjustment portions are provided between the middle region and both ends thereof. Therefore, the effect of suppression of the harmonic spurious vibration due to the mass adjustment portion can be appropriately functioned. In addition, the secondary mode spurious vibration appearing at a resonance point or an anti-resonance point, which is a conventional problem, can be efficiently suppressed.

Also, an embodiment relating to this arrangement is shown in FIGS. 7, 8 and 10 (described below). FIGS. 7 and 8 show arrangements of excitation electrodes on the front and rear surfaces of a crystal vibrating element relating to that arrangement. FIG. 10 is a graph showing frequency characteristics thereof. The crystal resonator used in this embodiment employs an AT-cut crystal vibrating element having a frequency of 120 MHz, and is a rectangular plate having an outer size whose Z-axis dimension is 1.8 mm and whose X-axis dimension is 1.2 mm. Conventionally, for example, when mass adjustment portions are provided in the middle regions of the longer sides of the front and rear excitation electrodes, harmonic spurious vibrations hsp as shown in FIG. 10 may significantly appear. However, in the arrangement of FIGS. 7 and 8, which is a specific embodiment relating to the above-described arrangement, as can be clearly seen from FIG. 10, significant a significant spurious vibration does not appear in the vicinity of a main vibration frequency f0. Also, the excitation level of the harmonic spurious vibration hsp is suppressed. Thereby, it is possible to obtain a crystal resonator for high frequencies that supports a specification about a spurious vibration that is typically required.

Also, in the arrangement, the mass adjustment portion may be a cut-out or a cut hole obtained by removing the excitation electrode, or a weight portion that weights the excitation electrode. As used herein, the cut-out refers to an arrangement that has an opening obtained by removing a portion of a side of the excitation electrode. The cut hole refers to an arrangement that does not have an opening in the vicinity of a side of the excitation electrode, is obtained by removing an electrode material, and is in the shape of a pit. Further, the weight portion is configured by additionally forming an electrode material, a resin or the like in the vicinity of a side of the excitation electrode.

Note that the cut-out or cut portion can be formed by incorporating a pattern or the like of the cut-out or cut portion into a vapor deposition mask pattern when the excitation electrode is formed. Also, the cut-out or cut portion may be configured so as to expose the crystal vibrating element, or alternatively, a thin thickness portion may be configured that has a smaller electrode thickness than that of other excitation electrode regions. Typically, the excitation electrode is composed of a multilayer film made of metal materials. As the cut-out or cut portion, a thin thickness portion may be formed by reducing the layered arrangement. With the arrangement in which such a cut-out or cut portion is made of a metal material, it is possible to adjust the metal material during typical frequency adjustment, thereby effectively adjusting spurious suppression.

The present inventor conducted a large number of demonstration experiments and found that, by setting the cut-out to have a predetermined appropriate size with respect to the excitation electrode, the influence of spurious vibration can be very efficiently removed and desired characteristics of a crystal resonator are obtained. Therefore, specifically, in the present invention, in order to suppress the secondary mode spurious vibration, a cut-out is formed in the middle region of the excitation electrode, and the cut-out has an opening dimension, where the ratio of the opening dimension to the dimension of a side of the excitation electrode at which the cut-out is formed is from 0.15 to 0.40 (hereinafter referred to as an opening dimension ratio), and a depth dimension, where the ratio of the depth dimension to the dimension of a side adjacent to that side is from 0.10 to 0.30 (hereinafter referred to as a depth dimension ratio), whereby a crystal resonator having satisfactory characteristics is obtained. Note that the specific embodiment of the crystal resonator will be described in the Description of the Invention section below.

Also, in order to suppress the secondary mode spurious vibration and the harmonic spurious vibration, as described above, a cut-out is formed in the middle region of the excitation electrode, and the cut-out has an opening dimension, where the ratio of the opening dimension to the dimension of a side of the excitation electrode at which the cut-out is formed is from 0.15 to 0.40 (hereinafter referred to as an opening dimension ratio), and a depth dimension, where the ratio of the depth dimension to the dimension of a side adjacent to that side is from 0.10 to 0.30 (hereinafter referred to as a depth dimension ratio), and a cut-out is formed in a region shifted from the middle of the excitation electrode, and the cut-out has an opening dimension, where the ratio of the opening dimension to the dimension of a side of the excitation electrode at which the cut-out is formed is from 0.06 to 0.20 (hereinafter referred to as an opening dimension ratio), and a depth dimension, where the ratio of the depth dimension to the dimension of a side adjacent to that side is from 0.10 to 0.30 (hereinafter referred to as a depth dimension ratio), whereby a crystal resonator having satisfactory characteristics is obtained. Note that the specific embodiment of the crystal resonator will be described in the Description of the Invention section below.

Next, demonstration data will be described. As demonstration data 1, demonstration data relating to the suppression of the secondary mode spurious vibration will be shown. A crystal vibrating element used in the demonstration has a rectangular plate that has a frequency of 120 MHz, a Z-axis dimension of 1.8 mm, and an X-axis dimension of 1.2 mm. A rectangular excitation electrode is formed in a middle region of the crystal vibrating element. While the number of cut-outs and the size of each cut-out were varied among demonstration samples, the occurrence of a spurious vibration and the level of the spurious vibration (response level) were studied. All crystal vibrating elements were produced by a typical mass-production process, which were considered to have a variation in thickness.

A basic electrode arrangement is shown in FIG. 1. A cut-out is provided in a middle region of each side of an excitation electrode. Table 1 shows dimensions and the like of an electrode formed in each sample. Note that, in Table 1, L represents an electrode dimension along a longer side direction, W represents an electrode dimension along a shorter-side direction, h (h1, h2) represents an opening dimension of the cut-out, and d (d1, d2) represents a depth dimension of the cut-out. For each cut-out, a longer side cut-out opening ratio is represented by h1/L, a longer side cut-out depth ratio is represented by d1/W, a shorter side cut-out opening ratio is represented by h2/W, and a shorter side cut-out depth ratio is represented by d2/L. The ratios shown are rounded off. Frequency characteristics data of each sample of Table 1 is described in FIGS. 26(a) to 26(f) and FIGS. 27(g) to 27(l). Note that, in FIGS. 26 and 27, the vertical axis represents impedances (Z) and the horizontal axis represents frequencies (FREQUENCY).

rious vibration level is suppressed and the spurious vibration is shifted in both the samples as shown in FIGS. 26(b) and 26(c). Note that the crystal vibrating elements of samples b and c have an arrangement in which the thicknesses in the vicinity of two opposite sides at which cut-outs are formed vary substantially uniformly.

Samples d and thereafter have an arrangement in which a cut-out is provided in the vicinity of a middle of each side of a rectangular excitation electrode, and the cut-outs have different sizes and shapes, for demonstration. In samples d to f, the cut-outs have a relatively small opening dimension and depth dimension, and the opening dimension ratios are less than 0.15, or the depth dimension ratios are less than 0.10, or both the dimension ratios are less than these respective values. As shown in FIGS. 26(d) to 26(f), by the formation of the cut-out, the spurious vibration level is reduced and the spurious vibration is shifted to the outside of the main vibration. However, when the dimension ratio is the above-described value or less, there is the possibility that the spurious vibration is coupled with the main vibration, depending on a location where the spurious vibration appears, so that precaution is required. Note that, for sample f, the longer side cut-out opening dimension ratio is shown as 0.15, but this is the result of rounding off and is substantially less than 0.15.

Samples g to k all have an opening dimension ratio of 0.15 or more or a depth dimension ratio of 0.10 or more. As shown in FIGS. 27(g) to 27(k), it can be understood that all frequency waveform data show that substantially no spurious vibration is present in the vicinity of the main vibration, and satisfac-

TABLE 1

|   | L(mm) longer side | W(mm) shorter side | h(mm) cut-out opening (h1, h2) | d(mm) cut-out depth (d1, d2) | h1/L longer side cut-out opening dimension ratio | d1/W longer side cut-out depth dimension ratio | h2/W shorter side cut-out opening dimension ratio | d2/L shorter side cut-out depth dimension ratio |
|---|---|---|---|---|---|---|---|---|
| a | 0.65 | 0.60 | — | — | — | — | — | — |
| b | 0.65 | 0.60 | 0.15 | 0.05 | 0.23 | 0.08 | — | — |
| c | 0.75 | 0.60 | 0.20 | 0.15 | — | — | 0.33 | 0.20 |
| d | 0.65 | 0.60 | 0.08 | 0.05 | 0.12 | 0.08 | 0.13 | 0.08 |
| e | 0.67 | 0.60 | 0.20 | 0.05 | 0.30 | 0.08 | 0.33 | 0.07 |
| f | 0.67 | 0.60 | 0.10 | 0.10 | 0.15 | 0.17 | 0.17 | 0.15 |
| g | 0.70 | 0.60 | 0.15 | 0.10 | 0.21 | 0.17 | 0.25 | 0.14 |
| h | 0.73 | 0.60 | 0.20 | 0.10 | 0.27 | 0.17 | 0.33 | 0.14 |
| i | 0.70 | 0.60 | 0.12 | 0.15 | 0.17 | 0.25 | 0.20 | 0.21 |
| j | 0.75 | 0.60 | 0.15 | 0.15 | 0.20 | 0.25 | 0.25 | 0.20 |
| k | 0.80 | 0.60 | 0.20 | 0.15 | 0.25 | 0.25 | 0.33 | 0.19 |
| l | 0.80 | 0.60 | 0.35 | 0.20 | 0.44 | 0.33 | 0.58 | 0.25 |

Sample a (conventional product) has an arrangement in which no cut-out is formed in a rectangular excitation electrode as shown in FIG. 23, and has two spurious vibrations sp that appear in main vibrations (between resonance and anti-resonance) as shown in FIG. 26(a). The reason for this is estimated to be that, when there is a variation in thickness in a crystal vibrating element, spurious vibrations occur along the X axis and the Z axis based on the imbalance of the fa mode. Also, the level of the spurious vibration is high. Note that the symbols representing the samples correspond to the respective numbers representing the frequency characteristics data of FIGS. 26 and 27. In FIGS. 26 and 27, sp represents a spurious vibration.

Sample b has an arrangement in which a cut-out is provided at a side along a Z-axis direction, and sample c has an arrangement in which a cut-out is provided at a side along an X-axis direction. Although the cut-outs have different sizes, the sputory frequency characteristics are obtained. Note that, in sample h, the cut-out is in the shape of a trapezoid, and the opening dimension of the cut-out is larger than the base dimension. Specifically, the cut-out has an arrangement similar to that of a cut-out shown in FIG. 4 (described below), and has an opening dimension h3 of 0.2 mm and a base dimension h31 of 0.15 mm. As can be seen from FIG. 27(h), a spurious vibration is efficiently suppressed in such an arrangement.

Note that, in the cut-out, when the opening dimension ratio or the depth dimension ratio is excessively large, a spurious vibration may occur due to other vibration modes depending on the design of the electrode, which may have an adverse influence on the frequency characteristics of the crystal resonator. Sample l shows that the cut-out has an opening dimension ratio exceeding 0.40 and a depth dimension ratio exceeding 0.30. In such a case, a significant spurious vibration caused by another vibration mode appears at a frequency higher than an anti-resonance point as shown in FIG. 27(*l*). Such a spurious vibration may disadvantageously have an adverse influence on the main vibration. Therefore, it can be understood from the above-described demonstration data that a crystal resonator can be obtained in which, when the cut-out has an opening dimension ratio of from 0.15 to 0.40 and a depth dimension ratio of from 0.15 to 0.30, the influence of the spurious vibration can be suppressed to the extent possible, and other electrical characteristics can be easily adjusted. Note that these characteristics have a similar tendency in other crystal vibrating elements in addition to those described above, and a crystal resonator having satisfactory characteristics can be obtained.

Also, in the arrangement, the opening dimension of the cut-out may be larger than the depth dimension of the cut-out. As can be seen from the above-described demonstration, sample i has the opening dimension ratio smaller than the depth dimension ratio, and the frequency characteristics data has a slightly higher spurious vibration level as shown in FIG. 27(*i*). In the other samples, the opening dimension ratio is larger than or similar to the depth dimension ratio, so that satisfactory frequency characteristics are obtained. Therefore, when the opening dimension is smaller than the depth dimension, the spurious vibration level tends to be large, and when the opening dimension is larger than the depth dimension, satisfactory frequency characteristics in which a spurious vibration is suppressed can be obtained, so that the arrangement can obtain more preferable characteristics.

Also, in the arrangement, an angular portion formed as a part of the cut-out may be curved. When the cut-out is formed in the present invention, a number of angular portions are formed in the rectangular excitation electrode. The excitation electrode is formed by laminating metal thin films, such as chromium, gold or the like, which are typically formed by vacuum vapor deposition, sputtering, or the like using a thin film production means. In such a case, the formation of an angular portion causes a chip of the metal thin film, and the free metal material may cause the occurrence of a spurious vibration or the like, likely leading to a reduction in the characteristics of the resonator. By curving the angular portion as in the arrangement, such a reduction in characteristics can be suppressed.

Also, in the arrangement, the opening dimension of the cut-out may be larger than the base dimension of the cut-out. With such an arrangement, the spurious vibration is efficiently suppressed. When the cut-out is large and deep, other spurious vibrations are likely to appear as described above. By causing the opening to be larger than the base, the occurrence of the spurious vibration is suppressed, thereby making it possible to improve the frequency characteristics. Note that, by providing a slope surface that allows the width of the opening to gradually increase from the base to the opening, the occurrence of a spurious vibration due to a new boundary condition is suppressed without creation of an unnecessary boundary condition. Specifically, as described above, sample h has a cut-out having the opening dimension larger than the base dimension, and has frequency characteristics data in which the spurious vibration is efficiently suppressed as can be seen from FIG. 27(*h*). Although a larger and deeper cut-out is likely to cause other spurious vibrations, the occurrence of the spurious vibration is suppressed by causing the opening to be larger than the base.

Next, as demonstration data 2, demonstration data relating to the suppression of the secondary mode spurious vibration and the harmonic spurious vibration will be shown. A crystal vibrating element used in the demonstration has a rectangular plate having a frequency of 120 MHz, a Z-axis dimension of 1.8 mm, and an X-axis dimension of 1.2 mm. The basic electrode arrangement is the same as that of FIGS. 7 and 8 (see the Description of the Invention section below). As shown in FIG. 7, in one of the excitation electrodes, cut-outs are provided in the longer side middle regions, and cut-outs are provided in the regions shifted from the middle regions toward both sides of the shorter sides. Also, as shown in FIG. 8, in the other excitation electrode, cut-outs are provided in the regions shifted from the middle regions toward both sides of the longer sides and the shorter sides. A total of 14 samples were used in the demonstration (see Table 2). By varying the sizes and the like of the cut-outs among the demonstration samples, the occurrence of a spurious vibration and the spurious vibration level (response level) were studied. All crystal vibrating elements were produced by a typical mass-production process, which are considered to have a variation in thickness.

Dimensions and the like of the electrodes formed in each sample are shown in Table 2. Note that, in each sample of Table 2, the cut-outs (see 51*c* and 51*f* of FIG. 7) in the longer side middle regions of one of the excitation electrodes have an opening dimension of 0.2 mm and a depth dimension of 0.2 mm (sample af), and an opening dimension of 0.2 mm and a depth dimension of 0.1 mm (the other samples). Also, in Table 2, L represents an electrode dimension along the longer side direction, W represents an electrode dimension along the shorter side direction, h represents an opening dimension of the cut-out, and d represents a depth dimension of the cut-out (see FIG. 7).

The cut-out relates to cut-outs other than the cut-out in the longer side middle region, and the cut-outs formed in each sample have the same size.

Note that, regarding each cut-out, the opening dimension ratio of the longer side cut-out is represented by h/L, the depth dimension ratio of the longer side cut-out is represented by d/W, the opening dimension ratio of the shorter side cut-out is represented by h/W, and the depth dimension ratio of the shorter side cut-out is represented by d/L. The ratios shown are rounded off. Frequency characteristics data of the samples of Table 2 are shown in FIGS. 28(*aa*) to 30(*an*). Note that, in FIGS. 28 to 30, the vertical axis represents impedances (Z) and the horizontal axis represents frequencies (FREQUENCY). In FIGS. 28 to 30, hsp indicates a harmonic spurious vibration.

TABLE 2

| | L(mm) longer side | W(mm) shorter side | h(mm) cut-out opening | d(mm) cut-out depth | h/L longer side cut-out opening dimension ratio | d/W longer side cut-out depth dimension ratio | h/W shorter side cut-out opening dimension ratio | d/L shorter side cut-out depth dimension ratio |
|---|---|---|---|---|---|---|---|---|
| aa | 0.82 | 0.68 | 0.03 | 0.1 | 0.04 | 0.15 | 0.04 | 0.12 |
| ab | 0.82 | 0.68 | 0.04 | 0.1 | 0.05 | 0.15 | 0.06 | 0.12 |
| ac | 0.82 | 0.68 | 0.05 | 0.05 | 0.06 | 0.07 | 0.07 | 0.06 |
| ad | 0.82 | 0.68 | 0.05 | 0.1 | 0.06 | 0.15 | 0.07 | 0.12 |

TABLE 2-continued

|    | L(mm) longer side | W(mm) shorter side | h(mm) cut-out opening | d(mm) cut-out depth | h/L longer side cut-out opening dimension ratio | d/W longer side cut-out depth dimension ratio | h/W shorter side cut-out opening dimension ratio | d/L shorter side cut-out depth dimension ratio |
|----|------|------|------|------|------|------|------|------|
| ae | 0.82 | 0.68 | 0.08 | 0.1  | 0.1  | 0.15 | 0.12 | 0.12 |
| af | 0.82 | 0.8  | 0.1  | 0.1  | 0.12 | 0.13 | 0.13 | 0.12 |
| ag | 0.81 | 0.8  | 0.16 | 0.08 | 0.2  | 0.1  | 0.2  | 0.1  |
| ah | 0.81 | 0.8  | 0.13 | 0.24 | 0.16 | 0.3  | 0.16 | 0.3  |
| ai | 0.82 | 0.68 | 0.08 | 0.2  | 0.1  | 0.29 | 0.12 | 0.24 |
| aj | 0.76 | 0.68 | 0.08 | 0.2  | 0.11 | 0.29 | 0.12 | 0.26 |
| ak | 0.82 | 0.68 | 0.08 | 0.22 | 0.1  | 0.32 | 0.12 | 0.27 |
| al | 0.76 | 0.68 | 0.08 | 0.24 | 0.11 | 0.35 | 0.12 | 0.32 |
| am | 0.76 | 0.68 | 0.15 | 0.08 | 0.2  | 0.12 | 0.22 | 0.11 |
| an | 0.81 | 0.68 | 0.17 | 0.08 | 0.21 | 0.12 | 0.25 | 0.1  |

Frequency characteristics relating to sample aa are shown in FIG. 28(aa). In sample aa, the longer side and shorter side cut-outs have an opening dimension ratio of less than 0.06, and harmonic spurious vibrations significantly appear. Frequency characteristics relating to sample ab will be shown in FIG. 28(ab). In sample ab, the longer side cut-out has an opening dimension ratio of less than 0.06, and harmonic spurious vibrations significantly appear. Frequency characteristics relating to sample ac are shown in FIG. 28(ac). In sample ac, the longer side and shorter side cut-outs have a depth dimension ratio of less than 0.10, and harmonic spurious vibrations significantly appear.

Frequency characteristics relating to sample ad are shown in FIG. 28(ad). In sample ad, one of harmonic spurious vibrations that is closer to the main vibration has a slightly higher spurious level, but substantially satisfactory characteristics are obtained. Frequency characteristics relating to samples ae to aj are shown in FIGS. 28(ae) to 29(aj). In all of these samples, the opening dimension ratio is in the range of 0.06 to 0.20 and the depth dimension ratio is in the range of 0.10 to 0.30. In such dimension ratio ranges, harmonic spurious vibrations are suppressed, so that substantially satisfactory characteristics are obtained.

Frequency characteristics relating to sample ak are shown in FIG. 29(ak). In sample ak, the depth dimension ratio of the longer side cut-out exceeds 0.3, and harmonic spurious vibrations significantly appear. Frequency characteristics relating to sample al are shown in FIG. 29(al). In sample al, the depth dimension ratios of the longer side and shorter side cut-outs exceed 0.3, and harmonic spurious vibrations significantly appear. Frequency characteristics of sample am are shown in FIG. 30(am). In sample am, the opening dimension ratio of the shorter side cut-out exceeds 0.2, and harmonic spurious vibrations significantly appear. Frequency characteristics relating to sample an are shown in FIG. 30(an). In sample an, the opening dimension ratios of the longer side and shorter side cut-outs exceed 0.2, and harmonic spurious vibrations significantly appear.

The above-described demonstration data shows a similar tendency even when the crystal vibrating elements have different sizes. For example, even in the case of other electrode arrangements of FIGS. 16 and 17, a similar cut-out size can be used to obtain practical satisfactory characteristics.

As shown in the demonstration data, the electrode pattern of the excitation electrode may differ between the front and rear surfaces in the above-described arrangement.

By providing or not providing a mass adjustment portion in the excitation electrode, adjusting the formation location or size thereof, or the like, the patterns of the front and rear excitation electrodes can be caused to differ from each other. For example, regarding an excitation electrode of one of lateral regions adjacent to a middle region, a mass adjustment portion may be formed only at the upper side on the front surface, while a mass adjustment portion may be formed only at the lower side (a side not opposed to the upper side). When the mass adjustment portions formed in the excitation electrodes have the same shape on the front and rear surfaces, a harmonic spurious vibration may contrarily significantly appear, but the amount of a mass adjustment portion formed can be adjusted by the above-described arrangement, thereby effectively and easily perform a spurious vibration.

Also, in the arrangement, the fundamental vibration frequency may be 100 MHz or more. As has been described in the Background Art section, the higher the frequency, the larger the frequency deviation per unit thickness. Taking into consideration the precision of a production technique of processing a flat surface of an actual crystal vibrating element, when the frequency exceeds 100 MHz, a variation is likely to occur in the thickness of the crystal vibrating element, which causes the imbalance of the fa mode, highly likely leading to the occurrence of a spurious vibration. Therefore, in a crystal resonator of 100 MHz or more, by applying the above-described arrangement of the cut-out of the excitation electrode, it is possible to efficiently suppress a spurious vibration that is caused due to the flatness of the crystal vibrating element even in a high-frequency crystal resonator.

EFFECTS OF THE INVENTION

As described above, the present invention can provide a crystal resonator having satisfactory characteristics, in which various spurious vibrations can be suppressed even when the crystal resonator is adapted to have a high frequency.

BRIEF DESCRIPTION OF DRAWINGS

FIG. 1 is a diagram schematically showing an arrangement of a crystal plate according to a first embodiment of the present invention.

FIG. 5 is a schematic plan view of a crystal plate according to a third embodiment of the present invention.

FIG. 6 is a schematic plan view showing an internal portion of a crystal resonator according to a fourth embodiment of the present invention.

FIG. 21 is a diagram schematically showing an arrangement of a crystal plate according to another embodiment of the first embodiment of the present invention. FIG. 21(a) is a schematic plan view of the crystal plate. FIG. 21(b) is a cross-sectional view, taken along line A'-A' of FIG. 21(a).

FIG. 22 is a diagram schematically showing an arrangement of a crystal plate according to another embodiment of the fifth embodiment of the present invention.

FIG. 24 is a diagram showing a crystal vibrating element in which front and rear surfaces are shaped in parallel.

FIG. 25 is a diagram showing a crystal vibrating element in which front and rear surfaces are obliquely shaped.

Figure 1A:
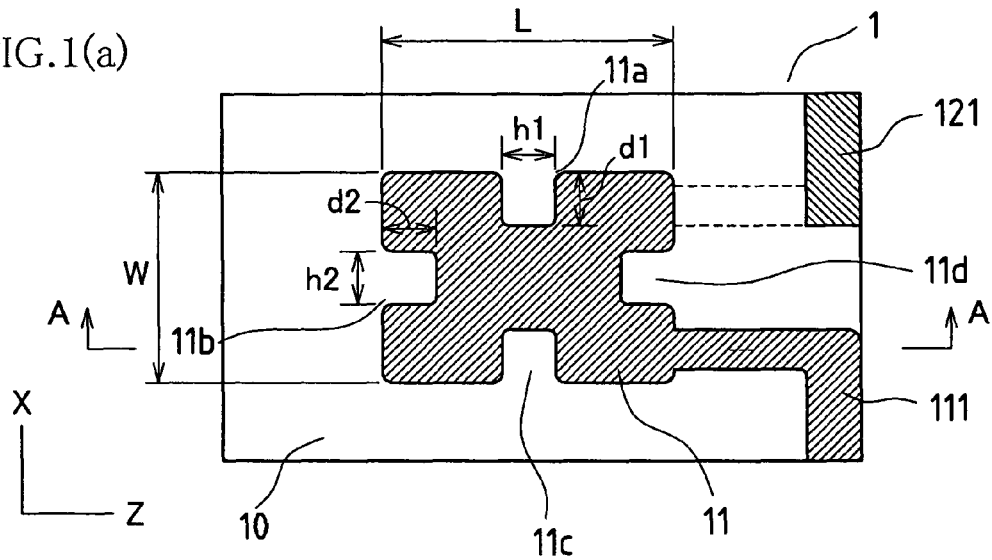
FIG. 1(a) is a schematic plan view of the crystal plate.

DESCRIPTION OF REFERENCE NUMERALS 1 crystal vibrating element
11, 12 excitation electrode
11a to 11d, 12a to 12d cut-out
111, 121 extension electrode

BEST MODE FOR CARRYING OUT THE INVENTION

Hereinafter, a first embodiment of the present invention will be described with reference to the accompanying drawings. In this embodiment, an AT-cut crystal plate that is driven by a thickness-shear mode will be described. Note that the above-described demonstration experiments on the cut-outs were conducted using the AT-cut crystal plate of the embodiment described below.

Figure 1B:
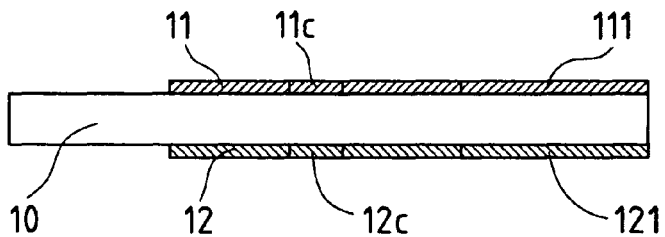
FIG. 1(b) is a cross-sectional view, taken along line A-A of FIG. 1(a).
Figure 2:
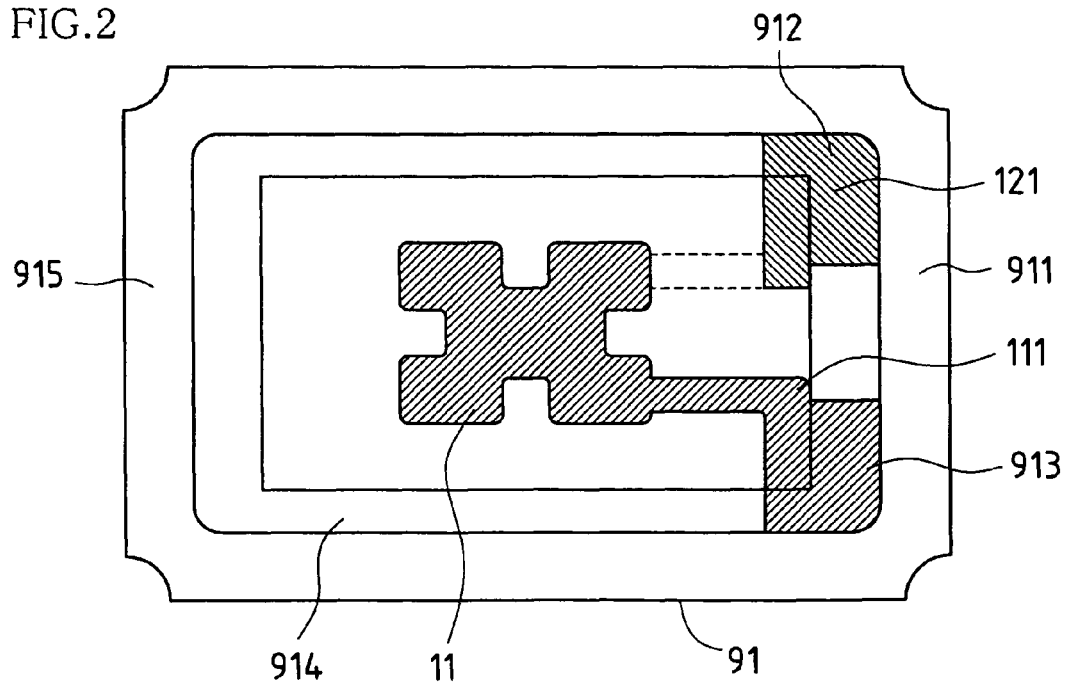
FIG. 2 is a schematic plan view showing an internal portion of the crystal resonator of the first embodiment of the present invention.

FIG. 1 is a diagram showing a surface mount crystal resonator. FIG. 1(a) is a plan view of a crystal vibrating element on the front and rear (front and rear surfaces) of which excitation electrodes are formed. FIG. 1(b) is a side view of FIG. 1(a). FIG. 2 is a plan view showing a state in which the crystal vibrating element is housed in a package.

The crystal vibrating element 1 (hereinafter referred to as a crystal plate) comprises an AT-cut crystal vibrating element in the shape of a plate (a rectangle as viewed from the top). Excitation electrodes 11 and 12 in the shape of a rectangle as viewed from the top are formed in middle regions of the front and rear surfaces. In the crystal plate 1, the Z axis is set to be along the longer sides and the X axis is set to be along the shorter sides. Each of the excitation electrodes 11 and 12 has the longer sides along the Z axis and the shorter sides along the X axis. The excitation electrodes 11 and 12 have the same shape and are exactly opposed to each other via the crystal plate 1. Rectangular cut-outs 11a, 11b, 11c, 11d, 12a, 12b, 12c and 12d are formed in middle regions of the sides of the excitation electrodes 11 and 12. These cut-outs 11a to 11d and 12a to 12d are mass adjustment portions that reduce the masses of the excitation electrodes 11 and 12. Note that a portion of the excitation electrode 12 formed on the rear surface and the cut-outs 12a, 12b, 12c and 12d formed in the excitation electrode 12 is not shown.

Also, angular portions of the excitation electrodes 11 and 12 and angular portions formed by the cut-outs 11a to 11d and 12a to 12d are curved (with a curvature). The excitation electrode 11 is extended via an extension electrode 111 to a shorter side of the crystal plate 1 and a corner portion of the shorter side. The excitation electrode 12 is extended via an extension electrode 121 to the other corner portion of the same shorter side. Note that the extension electrodes 111 and 121 are extended to the respective opposite surfaces via a side surface of the crystal plate 1.

Figure 27G:
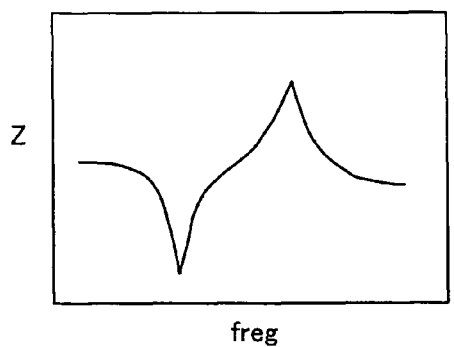
FIGS. 27(g) to 27(l) are graphs showing comparative data of the frequency characteristics of the crystal resonators as the samples of the demonstration data 1.
Figure 27H:
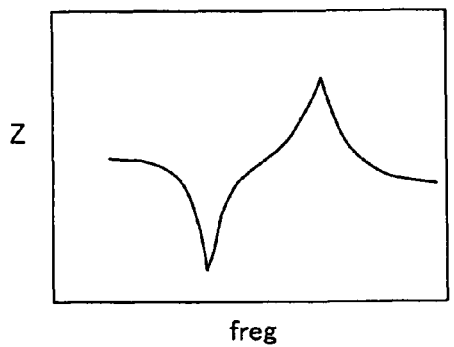
Figure 27I:
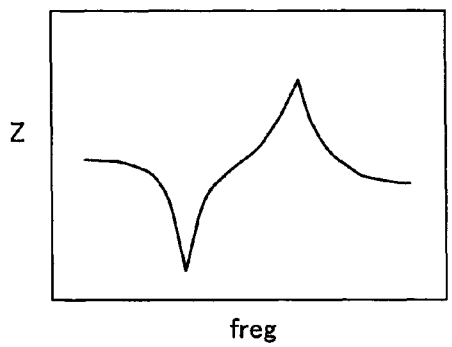
Figure 27J:
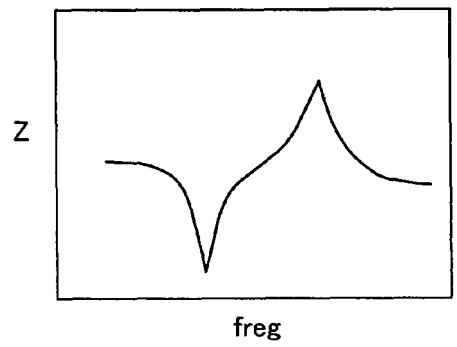
Figure 27K:
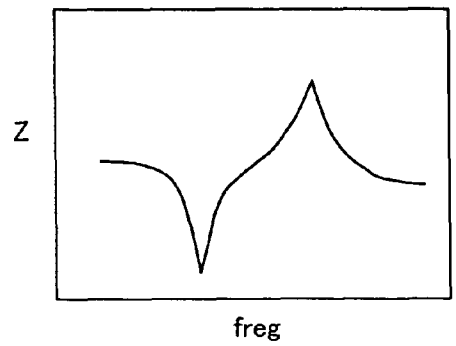
Figure 27L:
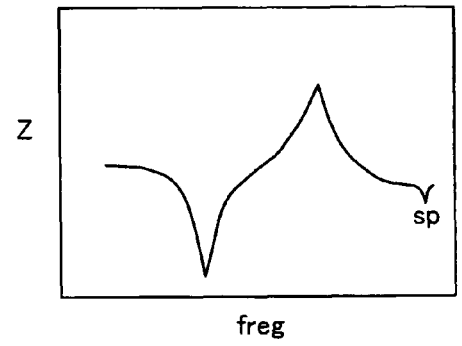
Figure 28:
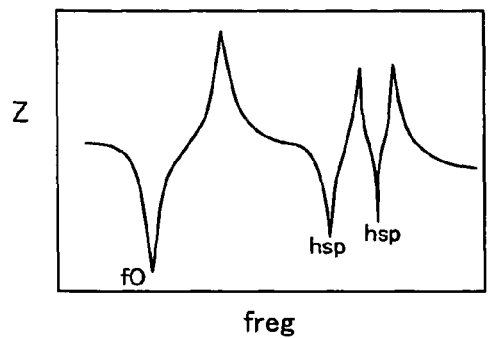
FIG. 28(aa) to 28(af) are graphs showing comparative data of the frequency characteristics of the crystal resonators as the samples of the demonstration data 2.
Figure 28:
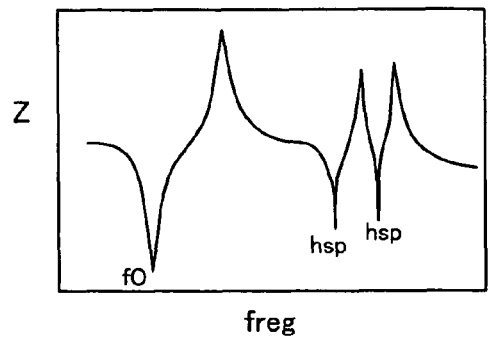
Figure 28:
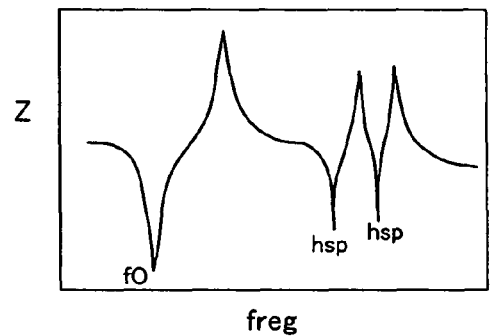
Figure 28:
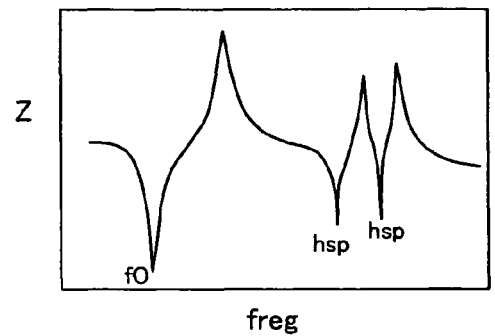
Figure 28:
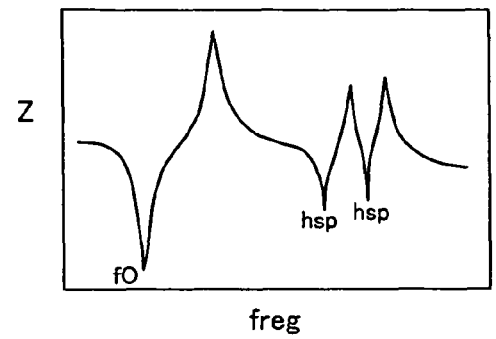
Figure 28:
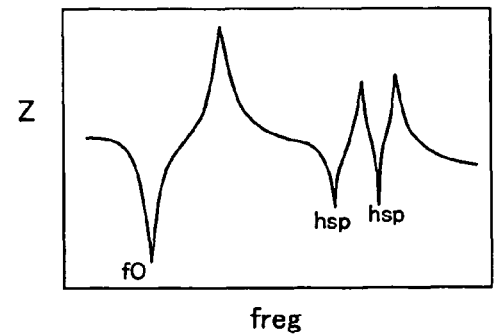
Figure 29:
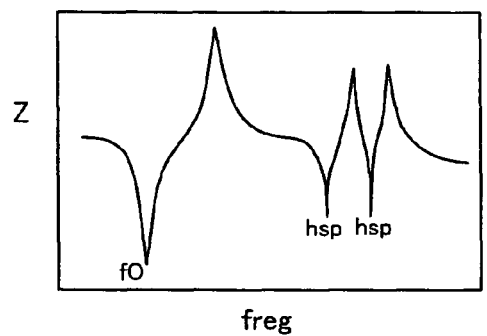
FIG. 29(ag) to 29(al) are graphs showing comparative data of the frequency characteristics of the crystal resonators as the samples of the demonstration data 2.
Figure 29:
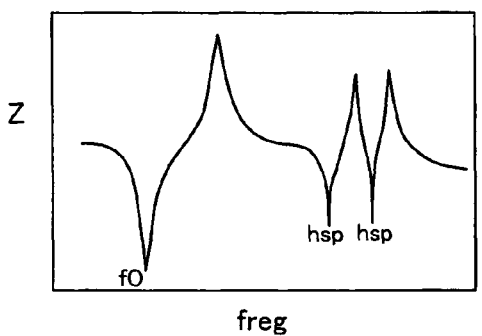
Figure 29:
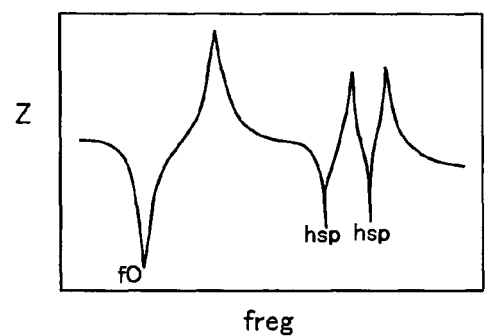
Figure 29:
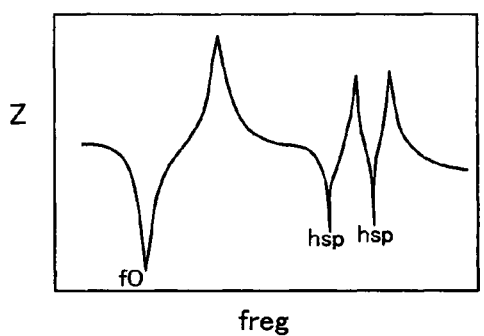
Figure 29:
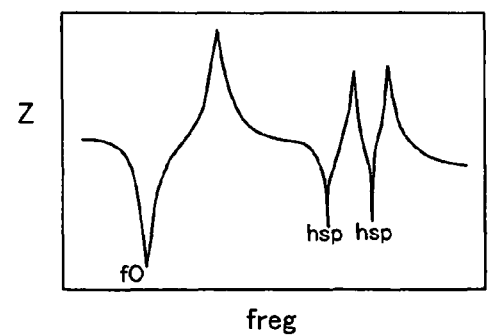
Figure 29:
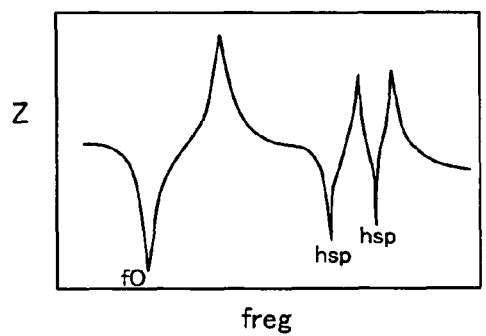
Figure 30:
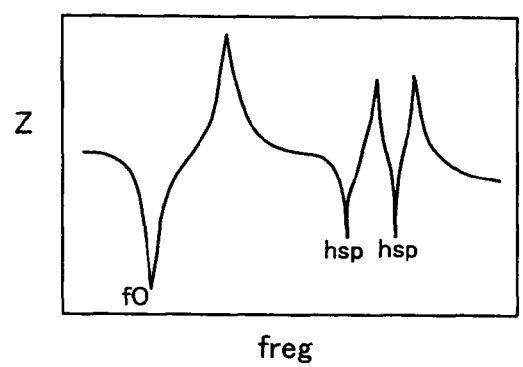
FIG. 30(am) to 28(an) are graphs showing comparative data of the frequency characteristics of the crystal resonators as the samples of the demonstration data 2.
Figure 30:
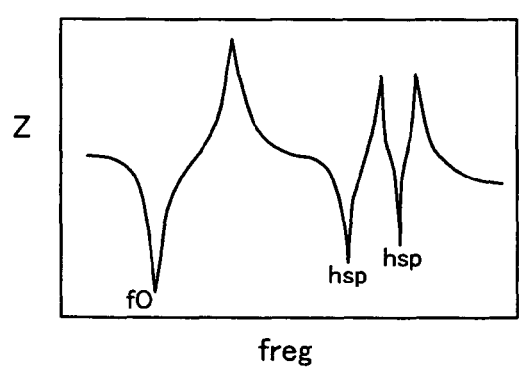

Note that, in this embodiment, the crystal plate 1 has a frequency of 120 MHz, a longer side dimension of 1.8 mm, and a shorter side dimension of 1.2 mm. The excitation electrodes 11 and 12 have a longer side dimension L of 0.7 mm, a shorter side dimension W of 0.6 mm, a longer side cut-out opening dimension h1 of 0.15 mm, a longer side cut-out depth dimension d1 of 0.1 mm, a shorter side cut-out opening dimension h2 of 0.15 mm, and a shorter side cut-out depth dimension d2 of 0.1 mm. Thus, the crystal plate 1 has an arrangement corresponding to that of sample g (see FIG. 27(g)).

The thus-configured crystal plate 1 is mounted in a package 91. FIG. 2 is a plan view showing a state in which the crystal plate 1 is mounted in the package 91. The package 91 is in the shape of a rectangle as viewed from the top, and is a ceramic package that is mainly made of ceramic and on inner and outer portions of which conductive wires are formed. The package 91 has a concave portion (U shape as viewed in a cross section) for housing the crystal plate 1, and a bank portion 911 around the concave portion. At an end in the longer side direction of the concave portion of the package 91, electrode pads 912 and 913 are formed on a stage higher than a base 914. The crystal plate 1 is supported at only one end thereof by the electrode pads 912 and 913. The one-end support is achieved by electrically and mechanically joining the extension electrodes 111 and 121 with the electrode pads 912 and 913 using a conductive junction material (not shown), such as a conductive adhesive, a conductive bump or the like. Thereafter, a stabilization process employing predetermined heating or the like is performed, and thereafter, a lid (not shown) is joined with an opening 915 of the package 91 by means of seam joining, beam joining, brazing or the like, so that the package 91 and the lid are hermetically sealed.

Figure 3:
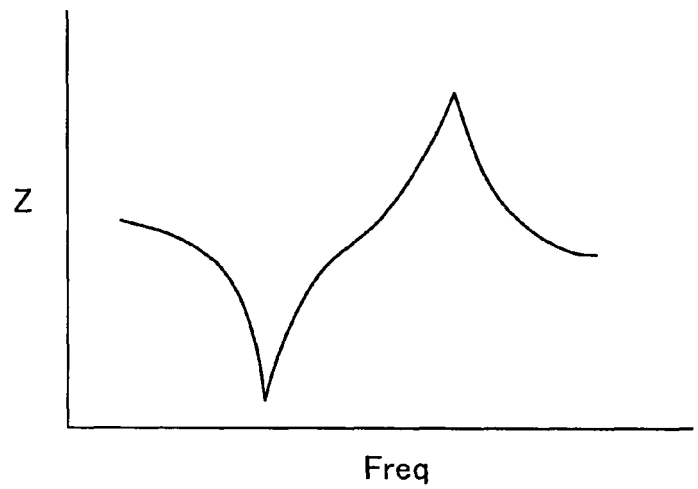
FIG. 3 is a graph showing frequency characteristics of the crystal resonator of the first embodiment of the present invention.

Frequency characteristics of the thus-configured crystal resonator were studied and were found as satisfactory characteristics in which a secondary mode spurious vibration is not present in the vicinity of main vibrations (between resonance and anti-resonance) as shown in FIG. 3.

Figure 4:
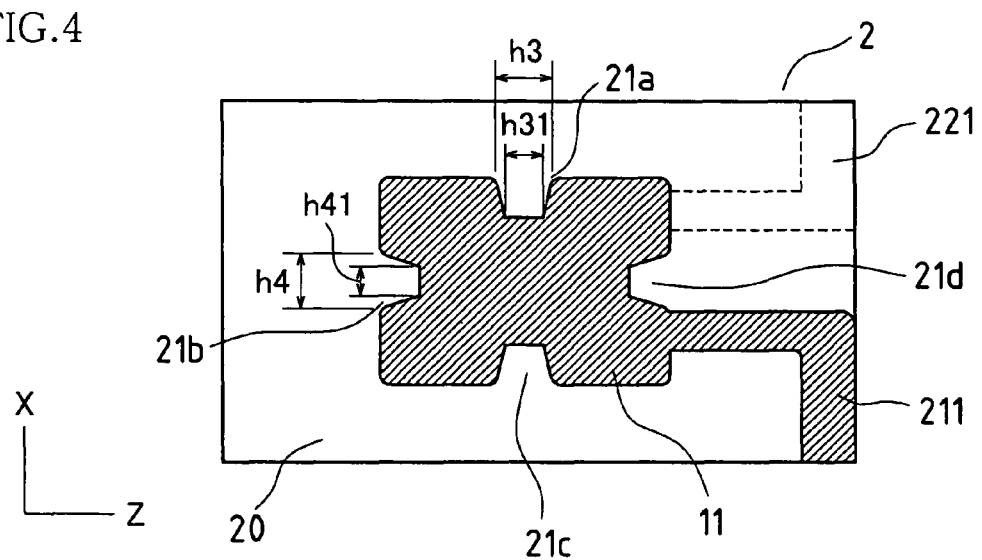
FIG. 4 is a schematic plan view of a crystal plate according to a second embodiment of the present invention.

A second embodiment of the present invention will be described with reference to FIG. 4. Also in this embodiment, as is similar to the embodiment above, a crystal vibrating element 2 (hereinafter referred to as a crystal plate) comprises an AT-cut crystal vibrating element in the shape of a plate (a rectangle as viewed from the top). Excitation electrodes 21 and 22 in the shape of a rectangle as viewed from the top are formed in middle regions of the front and rear (front and rear surfaces) of the crystal plate 2. In this embodiment, in the crystal plate 2, the X axis is set to be along the longer sides, and the Z axis is set to be along the shorter sides. Also, the excitation electrodes 21 and 22 have the longer sides along the X axis and the shorter sides along the Z axis.

Also, the excitation electrodes 21 and 22 have the same shape. Notches 21a, 21b, 21c, 21d, 22a, 22b, 22c and 22d are formed in the excitation electrodes 21 and 22. Note that the excitation electrode 22 formed on the rear surface and the cut-outs 22a, 22b, 22c and 22d formed in the excitation electrode 22 are not shown. The cut-outs 21a to 21d and 22a to 22d are each in the shape of substantially a trapezoid in which the base dimension is smaller than the opening dimension. Specifically, in the cut-outs 21a, 21c, 22a and 22c formed at the longer sides of the excitation electrodes 21 and 22, an opening dimension h3 is larger than a base dimension h31. Also, in the cut-outs 21b, 21d, 22b and 22d formed in the shorter sides of the excitation electrodes 21 and 22, an opening dimension h4 is larger than a base dimension h41. These cut-outs 21a to 21d and 22a to 22d are mass adjustment portions that reduce the masses of the excitation electrodes 21 and 22.

Also, angular portions of the excitation electrodes 21 and 22 and angular portions formed by the cut-outs 21a to 21d and 22a to 22d are curved (with a curvature). The excitation electrode 21 is extended via an extension electrode 211 to a shorter side of the crystal plate 2 and a corner portion of the shorter side. The excitation electrode 22 is extended via an extension electrode 221 to the other corner portion of the same shorter side. Note that the extension electrodes 211 and 221 are extended from portions close to the openings of the cut-outs 21d and 22d toward the shorter side.

A third embodiment of the present invention will be described with reference to FIG. 5. Also in this embodiment, as is similar to the embodiments above, a crystal vibrating element 3 (hereinafter referred to as a crystal plate) comprises an AT-cut crystal vibrating element in the shape of a plate (a rectangle as viewed from the top). Excitation electrodes 31 and 32 in the shape of a rectangle as viewed from the top are formed in middle regions of the front and rear (front and rear surfaces) of the crystal plate 3. In this embodiment, in the crystal plate 3, the X axis is set to be along the longer sides, and the Z axis is set to be along the shorter sides. Also, the excitation electrodes 31 and 32 have the longer sides along the X axis and the shorter sides along the Z axis. Also, the excitation electrodes 31 and 32 have the same shape and are exactly opposed to each other via the crystal plate 3. Notches 31a, 31b, 31c, 31d, 32a, 32b, 32c and 32d are formed in middle portions of the sides of the excitation electrodes 31 and 32. These cut-outs 31a to 31d and 32a to 32d are mass adjustment portions that reduce the masses of the excitation electrodes 31 and 32. Note that the excitation electrode 32 formed on the rear surface and the cut-outs 32a to 32d formed in the excitation electrode 32 are not shown. The cut-outs 31a to 31d and 32a to 32d each have a two-stage arrangement that has a wide opening and a narrow opening located deeper than the wide opening. For example, the cut-out 31a has a wide opening with a wide opening dimension h5 and a narrow opening with a narrow opening dimension h51 that is located deeper than the wide opening. Also, the cut-out 31b has a wide opening with a wide opening dimension h6 and a narrow opening with a narrow opening dimension h61 that is located deeper than the wide opening. The other cut-outs 31c, 31d and 32a to 32d also each have a wide opening and a narrow opening located deeper than the wide opening. With such a two-stage opening arrangement, it is possible to more efficiently suppress the secondary mode spurious vibration.

Also, the front-surface excitation electrode 31 is extended via an extension electrode 311 that extends in a direction oblique to the X-axis direction (oblique direction), to a shorter side of the crystal plate 3 and a corner portion of the shorter side. The rear-surface excitation electrode 32 is extended via an extension electrode 321 that extends in a direction oblique to the X-axis direction (oblique direction) to the other corner portion of the same shorter side.

A fourth embodiment of the present invention will be described with reference to FIG. 6. Also in this embodiment, as is similar to the embodiments above, a crystal plate 4 comprises an AT-cut crystal vibrating element in the shape of a plate (a rectangle as viewed from the top). Excitation electrodes 41 and 42 in the shape of a rectangle as viewed from the top are formed in middle regions of the front and rear (front and rear surfaces) of the crystal plate 4. In this embodiment, in the crystal plate 4, the Z axis is set to be along the longer sides, and the X axis is set to be along the shorter sides. Also, the excitation electrodes 41 and 42 have the longer sides along the Z axis and the shorter sides along the X axis. The excitation electrodes 41 and 42 have the same shape and are exactly opposed to each other via the crystal plate 4. Notches 41a, 41b, 41c, 41d, 42a, 42b, 42c and 42d are formed in middle regions of the sides of the excitation electrodes 41 and 42. These cut-outs 41a to 41d and 42a to 42d are mass adjustment portions that reduce the masses of the excitation electrodes 41 and 42. Note that the excitation electrode 42 formed on the rear surface and the cut-outs 42a to 42d formed in the excitation electrode 42 are not shown.

Also, angular portions of the excitation electrodes 41 and 42 and angular portions formed by the cut-outs 41a to 41d and 42a to 42d are curved (with a curvature). The front-surface excitation electrode 41 is extended via an extension electrode 411 to a shorter side of the crystal plate 4 and a corner portion of the shorter side. The rear-surface excitation electrode 42 is extended via an extension electrode 421 to the other corner portion of the other shorter side (located diagonal to that corner portion).

The thus-configured crystal plate 4 is mounted in a package 92. The package 92 is in the shape of a rectangle as viewed from the top, and is a ceramic package that is mainly made of ceramic and on inner and outer portions of which conductive wires are formed. The package 92 has a concave portion (U shape as viewed in a cross section) for housing the crystal plate 4, and a bank portion 921 around the concave portion. At both ends in the longer side direction of the concave portion of the package, electrode pads 922 and 923 are formed on a stage higher than a base 924. The crystal plate 4 is supported at both ends thereof that are joined with the electrode pads. The support and fixation, which are not shown, are achieved by electrically and mechanically joining the extension electrodes 411 and 421 with the electrode pads 922 and 923 using a conductive junction material, such as a conductive adhesive, a conductive bump or the like. Thereafter, a stabilization process employing predetermined heating or the like is performed, and thereafter, a lid (not shown) is joined with an opening 925 of the package 92 by means of seam joining, beam joining, brazing or the like, so that the package 92 and the lid are hermetically sealed.

A fifth embodiment of the present invention will be described with reference to the drawings. In this embodiment, an AT-cut crystal plate that is driven by a thickness-shear mode will be described.

Figure 7:
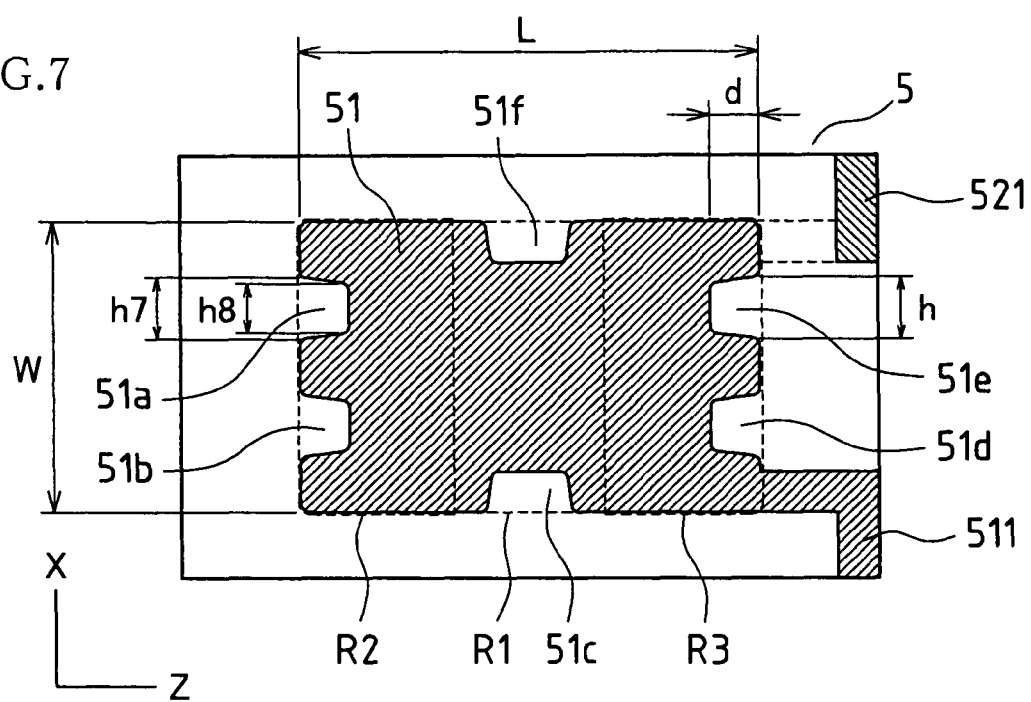
FIG. 7 is a schematic plan view of a crystal plate according to a fifth embodiment of the present invention.
Figure 8:
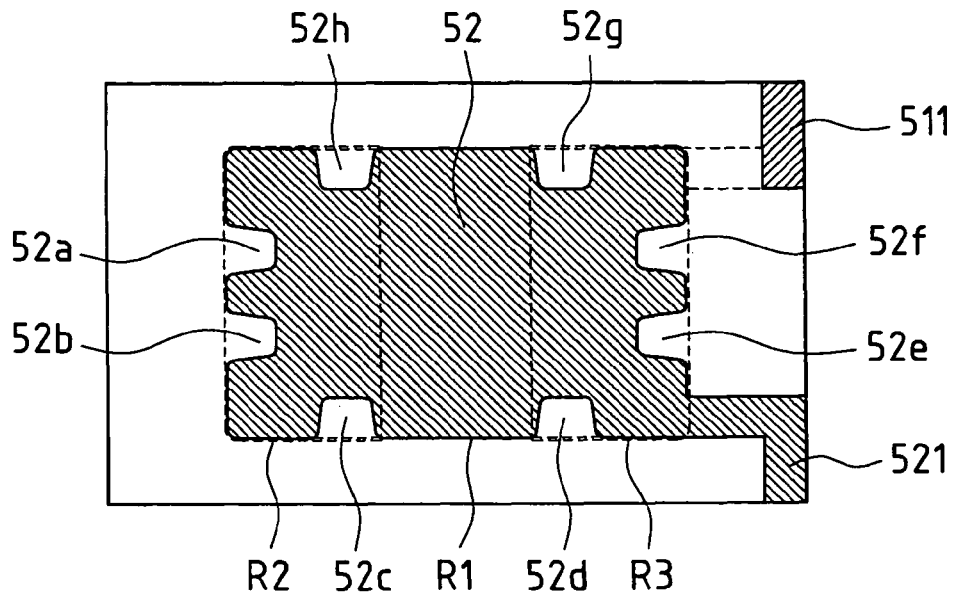
FIG. 8 is a schematic bottom view of the crystal plate of the fifth embodiment of the present invention.
Figure 9:
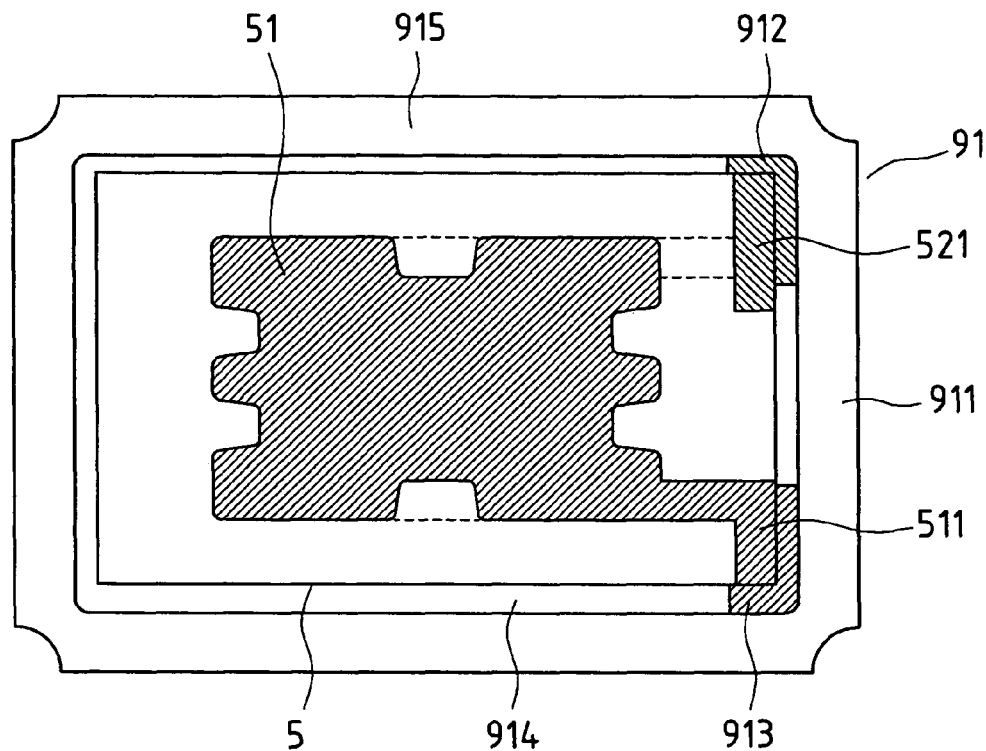
FIG. 9 is a schematic plan view showing an internal portion of the crystal resonator of the fifth embodiment of the present invention.

FIG. 7 is a plan view showing a front surface of a crystal vibrating element on which an excitation electrode is formed. FIG. 8 is a plan view showing a rear surface of the crystal vibrating element on which an excitation electrode is formed. FIG. 9 is a plan view showing a state in which the crystal vibrating element is housed in a package.

Also in this embodiment, as is similar to the embodiments above, a crystal vibrating element 5 (hereinafter referred to as a crystal plate) comprises an AT-cut crystal vibrating element in the shape of a plate (a rectangle as viewed from the top), where the X axis is set to be along the longer sides and the Z axis is set to be along the shorter sides. Also, excitation electrodes 51 and 52 are formed in middle regions (R1, R2 and R3 described below) of front and rear surfaces of the crystal plate 5, and extension electrodes 511 and 521 connected to the excitation electrodes 51 and 52, respectively, are formed. The excitation electrodes 51 and 52 also have longer sides along the X axis of the crystal plate and shorter sides along the Z axis, and have a rectangular shape as a whole, but have a plurality of cut-outs 51a, 51b, 51c, 51d, 51e, 51f, 52a, 52b, 52c, 52d, 52e and 52f that are formed on an outer circumference thereof. These cut-outs 51a to 51f and 52a to 52f are mass adjustment portions that reduce the masses of the excitation electrodes 51 and 52. The excitation electrodes 51 and 52 contact the crystal plate 5, and have an arrangement in which a chromium layer is formed by a technique, such as vacuum vapor deposition or the like, and a gold layer is formed on the chromium layer by a technique, such as vacuum vapor deposition or the like.

Specifically, in the excitation electrode 51 formed on the front surface of the crystal plate 5, the cut-outs 51f and 51c are provided in middle regions of the longer sides and are opposed to each other, as shown in FIG. 7. The cut-outs 51a and 51b are formed in one of the shorter sides. The cut-outs 51a and 51b are provided at locations slightly shifted from the middle region of the shorter side toward the longer sides. The cut-outs 51d and 51e are formed in the other shorter side. The cut-outs 51d and 51e are also provided at locations slightly shifted from the middle region of the shorter side toward the longer sides. With such an arrangement, the cut-outs 51a and 51e and the cut-outs 51b and 51d are respectively opposed to each other.

In the arrangement above, the excitation electrode 51 is divided into three equal parts, i.e., a middle region R1 in which the cut-outs 51f and 51c are formed, one lateral region R2 in which the cut-outs 51a and 51b are formed, and the other lateral region R3 in which the cut-outs 51d and 51e are formed. The three equal parts R1, R2 and R3 relate to a harmonic vibration mode, and for example, correspond to a vibration energy distribution in a (Y, X, Z)=(1, 3, 1) mode.

In the excitation electrode 52 formed on the rear surface of the crystal plate 5, the cut-outs 52g and 52h are formed at one of the longer sides, and the cut-outs 52c and 52d are formed at the other longer side, as shown in FIG. 8. The cut-outs 52h and 52c are opposed to each other and are located at positions shifted from the middle region R1 to the lateral region R2. The cut-outs 52g and 52d are opposed to each other and are located at positions shifted from the middle region R1 to the lateral region R3. The cut-outs 52a and 52b are formed at the shorter side of the lateral region R2, and the cut-outs 52f and 52e are formed at the shorter side of the lateral region R3. The cut-outs 52a and 52f and the cut-outs 52b and 52e are respectively opposed to each other. Note that the cut-outs 52a, 52b, 52e and 52f formed at the shorter sides have the same shape as that of the cut-outs 51a, 51b, 51d and 51e formed at the shorter sides on the front surface, and the cut-outs 52a, 52b, 52e and 52f and the cut-outs 51a, 51b, 51d and 51e are symmetric with respect to the crystal plate 5.

In the arrangement, the excitation electrode 52 is divided into substantially three equal parts, i.e., the middle region R1, the lateral region R2 in which the cut-outs 52h, 52a, 52b and 52c are formed, and the lateral region R3 in which the cut-outs 52g, 52f, 52e and 52d are formed, which correspond to the regions (R1, R2 and R3) into which the excitation electrode 51 is divided.

The excitation electrode 51 is extended via an extension electrode 511 to a shorter side of the crystal plate 5 and a corner portion of the shorter side. The excitation electrode 52 is extended via an extension electrode 521 to the other corner portion of the same shorter side. Note that the extension electrodes 511 and 521 are extended via a side surface of the crystal plate 5 to the respective opposite surfaces.

The cut-outs 51a to 51f and 52a to 52f are each in the shape of substantially a trapezoid in which the base dimension is smaller than the opening dimension. Specifically, for example, in the cut-out 51a, an opening dimension h7 is larger than a base dimension h8. Also, the other cut-outs 51b to 51f and 52a to 52f have a similar structure. Also, angular portions of the excitation electrodes 51 and 52 and angular portions formed by the cut-outs 51a to 51f and 52a to 52f are curved (with a curvature). Note that the opening dimension h7 of the cut-outs 51a, 51b, 51e and 51d of FIG. 7 corresponds to the opening dimension h of the cut-out of the demonstration data 2, and the depth dimension of the cut-outs 51a, 51b, 51e and 51d corresponds to the depth dimension d of the cut-out of the demonstration data 2.

Note that, in this embodiment, the crystal plate 5 has a main vibration frequency of 120 MHz, the crystal plate 5 has a longer side dimension of 1.8 mm and a shorter side dimension of 1.2 mm, and the excitation electrode 51 and 52 has a longer side dimension L of 0.7 mm and a shorter side dimension W of 0.6 mm. The cut-outs 51f and 51c at the longer sides of the front-surface excitation electrode 51 each have an opening dimension of 0.2 mm and a depth dimension of 0.1 mm, and the cut-outs 51a, 51b, 51d and 51e at the shorter sides each have an opening dimension of 0.07 mm and a depth dimension of 0.1 mm. The cut-outs 52g, 52h, 52c and 52d at the longer sides of the rear-surface excitation electrode 52 each have an opening dimension of 0.1 mm and a depth dimension of 0.1 mm, and the cut-outs 52a, 52b, 52e and 52f at the shorter sides each have an opening dimension of 0.07 mm and a depth dimension of 0.1 mm.

The thus-configured crystal plate 5 is mounted in a package 91. FIG. 9 is a plan view showing a state in which the crystal plate 5 is mounted in the package 91. The package 91 is in the shape of a rectangle as viewed from the top, and is a ceramic package that is mainly made of ceramic and on inner and outer portions of which conductive wires are formed. The package 91 has a concave portion (U shape as viewed in a cross section) for housing the crystal plate 5, and a bank portion 911 around the concave portion (i.e., the package 91 is in the shape of a box). At an end in the longer side direction of the concave portion of the package 91, electrode pads 912 and 913 are formed on a stage higher than a base 914. The crystal plate 5 is supported at only one end thereof by the electrode pads 912 and 913. The one-end support is achieved by electrically and mechanically joining the extension electrodes 511 and 521 with the electrode pads 912 and 913 using a conductive junction material (not shown), such as a conductive adhesive, a conductive bump or the like. Thereafter, a stabilization process employing predetermined heating or the like is performed, and thereafter, a lid (not shown) is joined with an opening 915 of the package 91 by means of seam joining, beam joining, brazing or the like, so that the package 91 and the lid are hermetically sealed.

Figure 10:
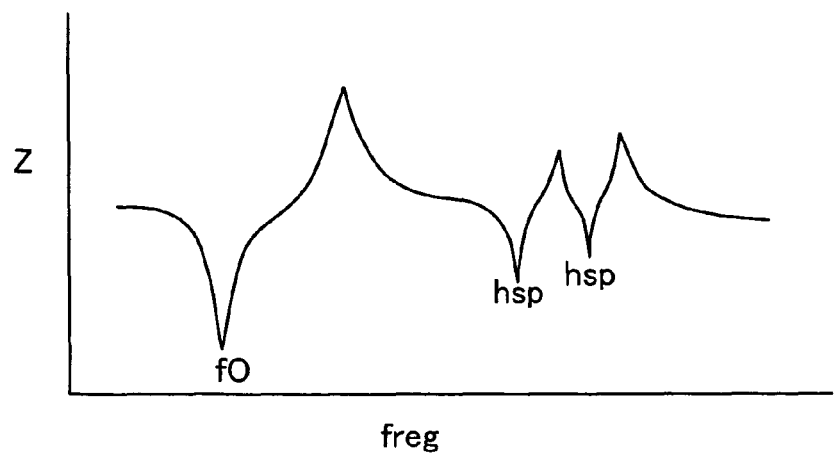
FIG. 10 is a graph showing frequency characteristics of the crystal resonator of the fifth embodiment of the present invention.

Frequency characteristics of the thus-configured crystal resonator were studied. It was found that a secondary mode spurious vibration is not present in the vicinity of a main vibration frequency f0 (resonance-anti-resonance), harmonic spurious vibrations hsp, which typically appear a frequency region slightly higher than the main vibration frequency f0, has a relatively low excitation level, as shown in FIG. 10. Therefore, it can be understood that a crystal resonator having satisfactory characteristics without an adverse influence of spurious vibration on the main vibration frequency f0 is obtained.

Figure 11:
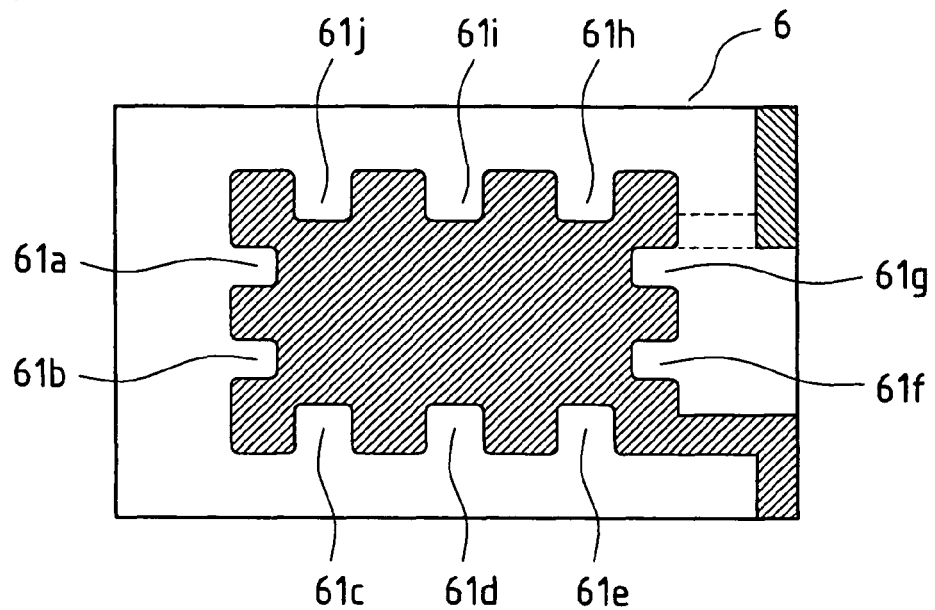
FIG. 11 is a schematic plan view of a crystal plate according to a sixth embodiment of the present invention.

A sixth embodiment of the present invention will be described with reference to FIG. 11. Also in this embodiment, as is similar to the embodiments above, a crystal plate 6 comprises an AT-cut crystal vibrating element in the shape of a plate (a rectangle as viewed from the top), where the X axis is set to be along the longer sides and the Z axis is set to be along the shorter sides. Excitation electrodes 61 and 62 (62 is not shown) are formed in middle regions of the front and rear (front and rear surfaces) of the crystal plate 6. The excitation electrodes 61 and 62 have longer sides along the X axis of the crystal plate and shorter sides along the Z axis, and have a rectangular shape as a whole, but have a plurality of cut-outs 61a to 61j and 62a to 62j (62a to 62j are not shown) that are formed on an outer circumference thereof. These cut-outs 61a to 61j and 62a to 62j are mass adjustment portions that reduce the masses of the excitation electrodes 61 and 62.

Regarding the excitation electrode 61 formed on the front surface of the crystal plate 6, at the longer sides of the excitation electrode 61, the cut-outs 61i and 61d are formed in a middle region, the cut-outs 61j and 61c are formed in one of lateral regions on both sides of the middle region, and the cut-outs 61h and 61e are formed in the other lateral region. At the shorter sides, the cut-outs 61a and 61b are formed at locations slightly shifted from a middle of the shorter side of the one lateral region toward the longer sides, and the cut-outs 61g and 61f are formed at locations slightly shifted from a middle of the shorter side of the other lateral region toward the longer sides. Note that the cut-outs 61a and 61g and the cut-outs 61b and 61f are respectively opposed to each other. In the excitation electrode 62 formed on the rear surface of the crystal plate 6, the cut-outs 62a to 62j are formed, corresponding to the cut-outs 61a to 61j formed in the excitation electrode 61, though the cut-outs 62a to 62j are not shown.

The excitation electrode 61 is extended via an extension electrode 611 to a shorter side of the crystal plate 2 and a corner portion of the shorter side. The excitation electrode 62 is extended via an extension electrode 621 to the other corner portion of the same shorter side. Note that, in this embodiment, the extension electrodes 611 and 621 are extended from portions close to openings of the cut-outs 61f and 61g toward the shorter side, and are then extended along the shorter side to the respective corner portions. Note that angular portions of the excitation electrodes 61 and 62 and angular portions formed by the cut-outs 61a to 61j and 62a to 62j are curved (with a curvature).

The thus-configured crystal plate 6 is mounted in the package 91 as shown in FIG. 9 (not shown). The package 91 is in the shape of a rectangle as viewed from the top, and is a ceramic package that is mainly made of ceramic and on inner and outer portions of which conductive wires are formed. The package 91 has a concave portion (U shape as viewed in a cross section) for housing the crystal plate 5, and a bank portion 911 around the concave portion (i.e., the package 91 is in the shape of a box). At an end in the longer side direction of the concave portion of the package 91, electrode pads 912 and 913 are formed on a stage higher than a base 914. The crystal plate 4 is supported at only one end thereof by the electrode pads 912 and 913. The one-end support is achieved by electrically and mechanically joining the extension electrodes 611 and 621 with the electrode pads 912 and 913 using a conductive junction material (not shown), such as a conductive adhesive, a conductive bump or the like. Thereafter, a stabilization process employing predetermined heating or the like (e.g., an annealing process, etc.) is performed, and thereafter, a lid (not shown) is joined with an opening 915 of the package 91 by means of seam joining, beam joining, brazing or the like, so that the package 91 and the lid are hermetically sealed.

Figure 12:
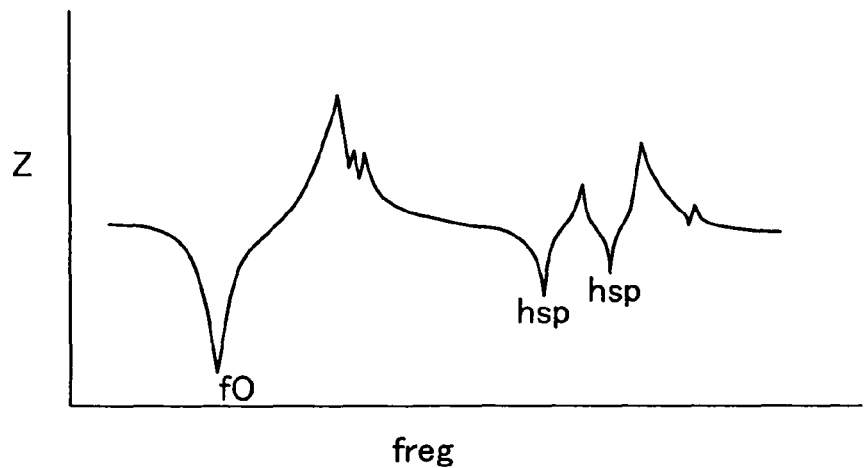
FIG. 12 is a graph showing frequency characteristics of the crystal resonator of the sixth embodiment of the present invention.

Frequency characteristics of the thus-configured crystal resonator were studied. It was found that a secondary mode spurious vibration is not present in the vicinity of a main vibration frequency f0 (resonance-anti-resonance), harmonic spurious vibrations hsp, which typically appear a frequency region slightly higher than the main vibration frequency f0, have a slightly high but a relatively low excitation level, as shown in FIG. 12. Thus, satisfactory characteristics were obtained without an adverse influence of spurious vibration on the main vibration frequency f0. Note that the crystal plate 6 used here has a frequency of 120 MHz, the crystal plate 6 has a longer side dimension of 1.8 mm and a shorter side dimension of 1.2 mm, and the excitation electrodes 61 and 62 have a longer side dimension L of 0.7 mm and a shorter side dimension W of 0.6 mm. The cut-outs 61a to 61j and 62a to 62j have the same shape, and have an opening dimension of 0.07 mm and a depth dimension of 0.1 mm.

A seventh embodiment of the present invention will be described with reference to FIGS. 13 and 14. Also in this embodiment, as is similar to the embodiments above, a crystal vibrating element 7 (hereinafter referred to as a crystal plate) comprises an AT-cut crystal vibrating element in the shape of a plate, where the X axis is set to be along the longer sides and the Z axis is set to be along the shorter sides. Excitation electrodes 71 and 72 are formed in middle regions of the front and rear (front and rear surfaces) of the crystal plate 7. The excitation electrodes 71 and 72 have longer sides along the X axis and shorter sides along the Z axis, and have a rectangular shape as a whole, but have a plurality of cut-outs 71a to 71f and 72a to 72f that are formed on an outer circumference thereof. These cut-outs 71a to 71f and 72a to 72f are mass adjustment portions that reduce the masses of the excitation electrodes 71 and 72.

Figure 13:
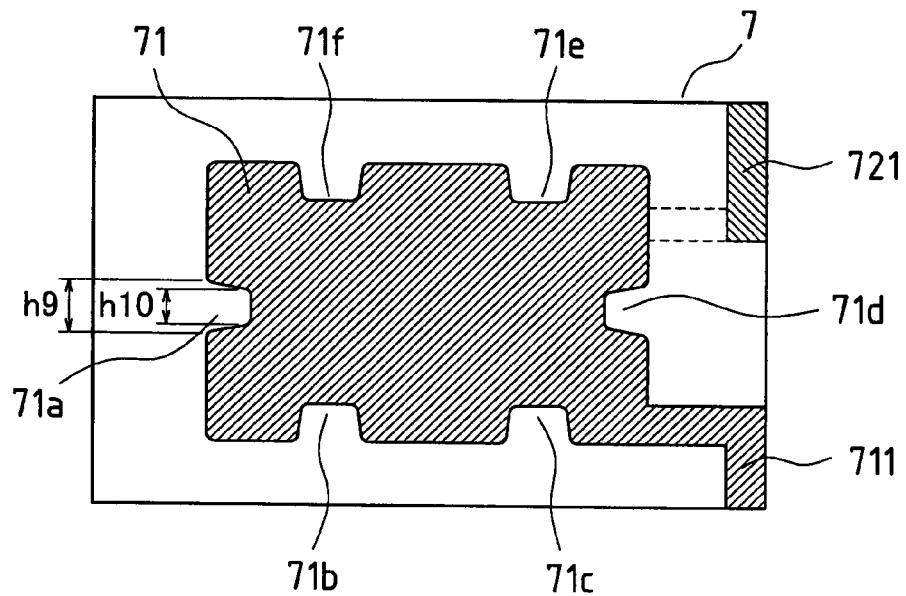
FIG. 13 is a schematic plan view of a crystal plate according to a seventh embodiment of the present invention.

As shown in FIG. 13, in the excitation electrode 71 formed on the front surface of the crystal plate 7, the cut-outs 71a and 71d are provided in middle regions of the shorter sides and are opposed to each other. At the longer sides, the cut-outs 71e, 71f, 71b and 71c are formed. The cut-outs 71e, 71f, 71b and 71c are provided at locations shifted from middle regions of the longer sides toward the shorter sides. The shifted locations correspond to one lateral region R2 and the other lateral region R3 obtained by dividing the longer side into three equal parts. The cut-outs 71f and 71b are opposed to each other in the lateral region R2, and the cut-outs 71e and 71c are opposed to each other in the lateral region R3.

Figure 14:
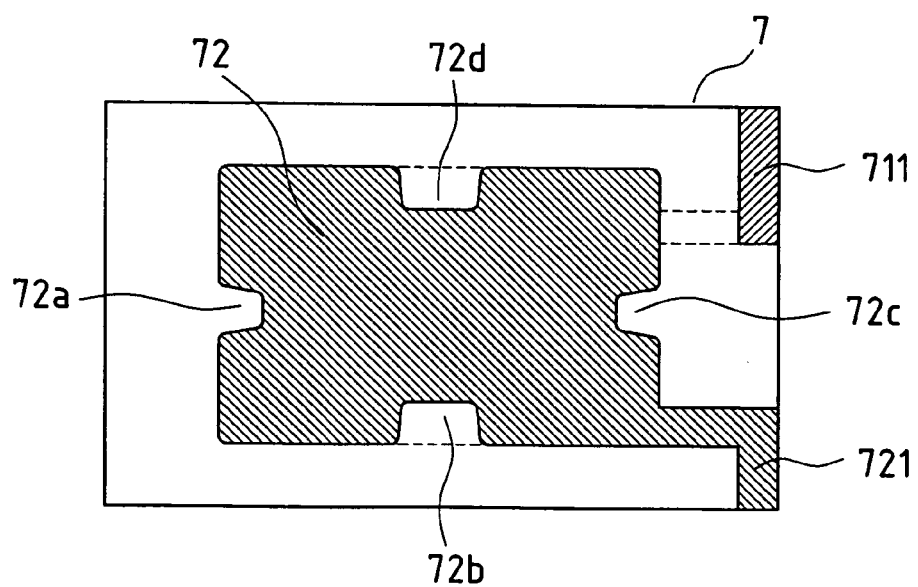
FIG. 14 is a schematic bottom view of the crystal plate of the seventh embodiment of the present invention.

As shown in FIG. 14, in the excitation electrode 72 formed on the rear surface of the crystal plate 7, the cut-outs 72a and 72c are formed in middle regions of the shorter sides and are opposed to each other. The cut-outs 72d and 72b are formed in middle regions of the longer sides and are opposed to each other. The cut-outs 72a and 72c at the shorter sides are opposed via the crystal plate 7 to the cut-outs 71a and 71d formed at the shorter sides of the front-surface excitation electrode 71. The cut-outs 71a to 71f and 72a to 72d are each in the shape of substantially a trapezoid in which the base dimension is smaller than the opening dimension. Specifically, for example, in the cut-out 71a, an opening dimension h9 is larger than a base dimension h10. The other cut-outs 71b to 71f and 72a to 72d have a similar structure. Also, angular portions of the excitation electrodes 71 and 72 and angular portions formed by the cut-outs 71a to 71f and 72a to 72d are curved (with a curvature).

The excitation electrode 71 is extended via an extension electrode 711 to a shorter side of the crystal plate 2 and a corner portion of the shorter side. The excitation electrode 72 is extended via an extension electrode 721 to the other corner portion of the same shorter side. Note that, in this embodiment, the extension electrodes 711 and 721 are extended toward the respective shorter sides, and thereafter, are extended along the shorter sides to the respective corner portions. Alternatively, the extension electrodes 711 and 721 may be obliquely extended from the excitation electrodes 71 and 72 toward the corner portions.

The cut-outs 71a to 71f and 72a to 72f are each in the shape of substantially a trapezoid in which the base dimension is smaller than the opening dimension. Specifically, for example, in the cut-out 71a, an opening dimension h7 is larger than a base dimension h8. The other cut-outs 71b to 71f and 72a to 72f have a similar structure. Also, angular portions of the excitation electrodes 71 and 72 and angular portions formed by the cut-outs 71b to 71f and 72a to 72f are curved (with a curvature).

The thus-configured crystal plate 7 is mounted in the package 91 as shown in FIG. 9 (not shown). The package 91 is in the shape of a rectangle as viewed from the top, and is a ceramic package that is mainly made of ceramic and on inner and outer portions of which conductive wires are formed. The package 91 has a concave portion (U shape as viewed in a cross section) for housing the crystal plate 1, and a bank portion 911 around the concave portion (i.e., the package 91 is in the shape of a box). At an end in the longer side direction of the concave portion of the package 91, electrode pads 912 and 913 are formed on a stage higher than a base 914. The crystal plate 5 is supported at only one end thereof by the electrode pads 912 and 913. The one-end support is achieved by electrically and mechanically joining the extension electrodes 711 and 721 with the electrode pads 912 and 913 using a conductive junction material (not shown), such as a conductive adhesive, a conductive bump or the like. Thereafter, a stabilization process employing predetermined heating or the like (e.g., an annealing process, etc.) is performed, and thereafter, a lid (not shown) is joined with an opening 915 of the package 91 by means of seam joining, beam joining, brazing or the like, so that the package 91 and the lid are hermetically sealed.

Figure 15:
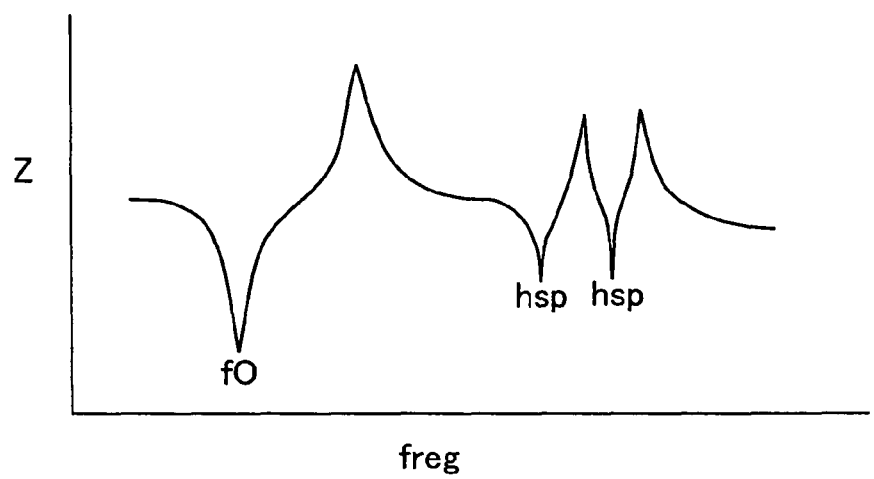
FIG. 15 is a graph showing frequency characteristics of the crystal resonator of the seventh embodiment of the present invention.

Frequency characteristics of the thus-configured crystal resonator were studied. It was found that a secondary mode spurious vibration is not present in the vicinity of a main vibration frequency f0 (resonance-anti-resonance), harmonic spurious vibrations hsp, which typically appear a frequency region slightly higher than the main vibration frequency f0, have a slightly high but a relatively low excitation level, as shown in FIG. 15, and thus, satisfactory characteristics without an adverse influence of spurious vibration on the main vibration were obtained. Note that the crystal plate 7 used here has a frequency of 120 MHz, the crystal plate 7 has a longer side dimension of 1.9 mm and a shorter side dimension of 1.3 mm, and the excitation electrodes 71 and 72 have a longer side dimension L of 0.8 mm and a shorter side dimension W of 0.7 mm. The shorter side cut-outs 71a, 71d, 72a and 72c have the same shape, and have an opening dimension of 0.07 mm and a depth dimension of 0.1 mm. The longer side cut-outs 71e, 71f, 71b, 71c, 72b and 72d have the same shape, and have an opening dimension of 0.15 mm and a depth dimension of 0.1 mm.

An eighth embodiment of the present invention will be described with reference to FIGS. 16 and 17. Also in this embodiment, as is similar to the embodiments above, a crystal vibrating element 8 (hereinafter referred to as a crystal plate) comprises an AT-cut crystal vibrating element in the shape of a plate, where the Z axis is set to be along the longer sides and the X axis is set to be along the shorter sides. Excitation electrodes 81 and 82 are formed in middle regions of the front and rear (front and rear surfaces) of the crystal plate 8. The excitation electrodes 81 and 82 have longer sides along the Z axis and shorter sides along the X axis, and have a rectangular shape as a whole, but have a plurality of cut-outs 81a to 81f and 82a to 82f that are formed on an outer circumference thereof. These cut-outs 81a to 81f and 82a to 82f are mass adjustment portions that reduce the masses of the excitation electrodes 81 and 82.

Figure 16:
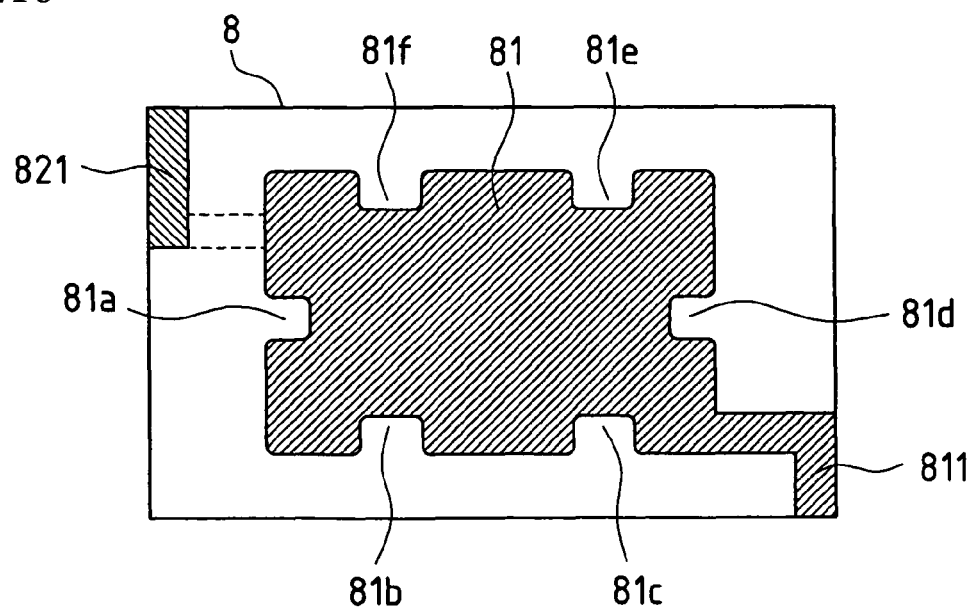
FIG. 16 is a schematic plan view of a crystal plate according to an eighth embodiment of the present invention.

As shown in FIG. 16, in the excitation electrode 81 formed on the front surface of the crystal plate 8, the cut-outs 81a and 81d are provided in middle regions of the shorter sides and are opposed to each other. In the longer sides, the cut-outs 81e, 81f, 81b and 81c are formed. The cut-outs 81e, 81f, 81b and 81c are provided at locations shifted from middle regions of the longer sides toward the shorter sides. The shifted locations correspond to one lateral region R2 and the other lateral region R3 obtained by dividing the longer side into three equal parts. The cut-outs 81f and 81b are opposed to each other in the lateral region R2, and the cut-outs 81e and 81c are opposed to each other in the lateral region R3.

Figure 17:
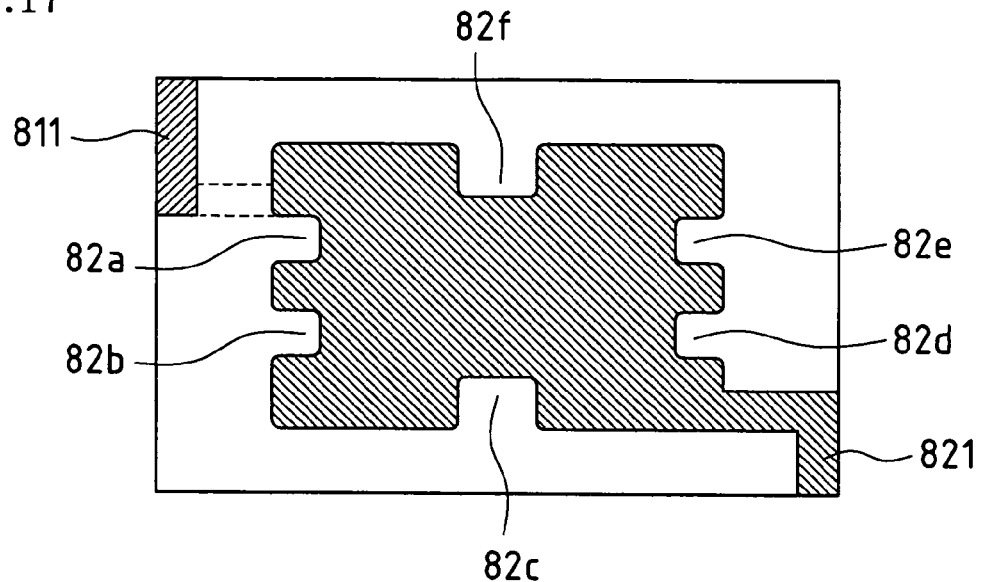
FIG. 17 is a schematic bottom view of the crystal plate of the eighth embodiment of the present invention.

As shown in FIG. 17, in the excitation electrode 82 formed on the rear surface of the crystal plate 8, the cut-outs 82a and 82b are formed in parallel in portions slightly shifted from a middle region of one shorter side toward the longer sides, and the cut-outs 82d and 82e are formed in parallel in portions slightly shifted from a middle region of the other shorter side toward the longer sides. Also, the cut-outs 82f and 82c having a wide opening are provided in middle portions of the longer sides and are opposed to each other.

The excitation electrode 81 is extended via an extension electrode 811 to a shorter side of the crystal plate 2 and a corner portion of the shorter side. The excitation electrode 82 is extended via an extension electrode 821 to a corner portion of the other shorter side diagonal to that corner portion. In other words, both the short sides of the crystal plate 8 are held (both-end support). Note that, in this embodiment, the extension electrodes 811 and 821 are extended from portions close to the openings of the cut-outs 81f and 81g toward the shorter sides, and thereafter, are extended along the shorter sides to the respective angular portions.

In this embodiment, the cut-outs 81a to 81f and 82a to 82f (e.g., the cut-outs 82a and 82b) have the same opening dimension and the same base dimension at each side of the excitation electrodes 81 and 82. Also, angular portions of the excitation electrodes 81 and 82 and angular portions formed by the cut-outs 81a to 81f and 82a to 82f are curved with a small curvature.

The thus-configured crystal plate 8 is mounted in the package 92 as shown in FIG. 6 (not shown). The package 92 for holding the crystal plate 8 needs to have an arrangement that holds both ends in the longer side direction (i.e., both the shorter sides) of the crystal plate 8. Therefore, at both the ends in the longer side direction in the package 92, electrode pads 922 and 923 for supporting the crystal plate 8 are formed. The electrode pads 922 and 923 are electrically and mechanically joined with the extension electrodes 811 and 821 using a conductive junction material, such as a conductive adhesive, a conductive bump or the like. Thereafter, a stabilization process employing predetermined heating (e.g., an annealing process, etc.) is performed, and thereafter, a lid (not shown) is joined with an opening 925 of the package 92 by means of seam joining, beam joining, brazing or the like, so that the package 92 and the lid are hermetically sealed.

Figure 18:
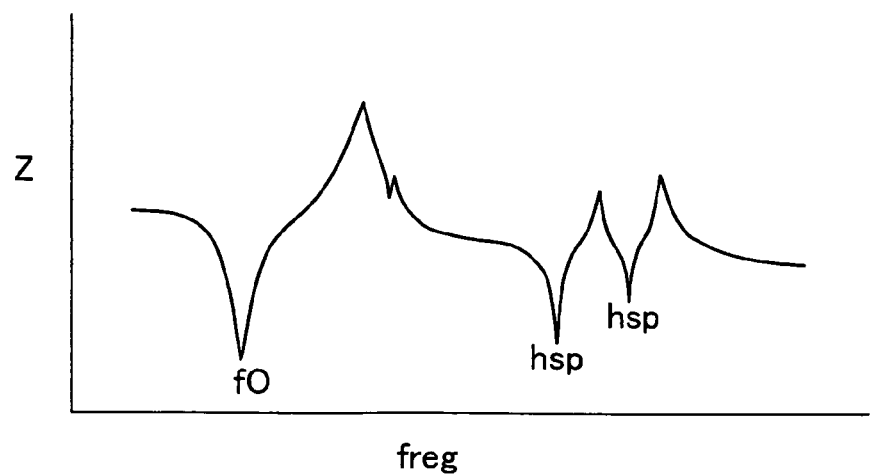
FIG. 18 is a graph showing frequency characteristics of the crystal resonator of the eighth embodiment of the present invention.

Frequency characteristics of the thus-configured crystal resonator were studied. It was found that a secondary mode spurious vibration is not present in the vicinity of a main vibration frequency f0, and harmonic spurious vibrations hsp, which typically appear a frequency region slightly higher than the main vibration frequency f0, have a relatively low excitation level, as shown in FIG. 18. Thus, satisfactory characteristics were obtained without an adverse influence of spurious vibration on the main vibration frequency f0. Note that the crystal plate 8 used here has a frequency of 120 MHz, the crystal plate 8 has a longer side dimension of 1.8 mm and a shorter side dimension of 1.2 mm, and the excitation electrodes 81 and 82 have a longer side dimension L of 0.7 mm and a shorter side dimension W of 0.6 mm. The cut-outs 81a, 81b, 81c, 81d, 81e and 81f have an opening dimension of 0.1 mm and a depth dimension of 0.1 mm. The cut-outs 82f and 82c have an opening dimension of 0.2 mm and a depth dimension of 0.1 mm. The cut-outs 82a, 82b, 82d and 82e have an opening dimension of 0.07 mm and a depth dimension of 0.1 mm.

Figure 19:
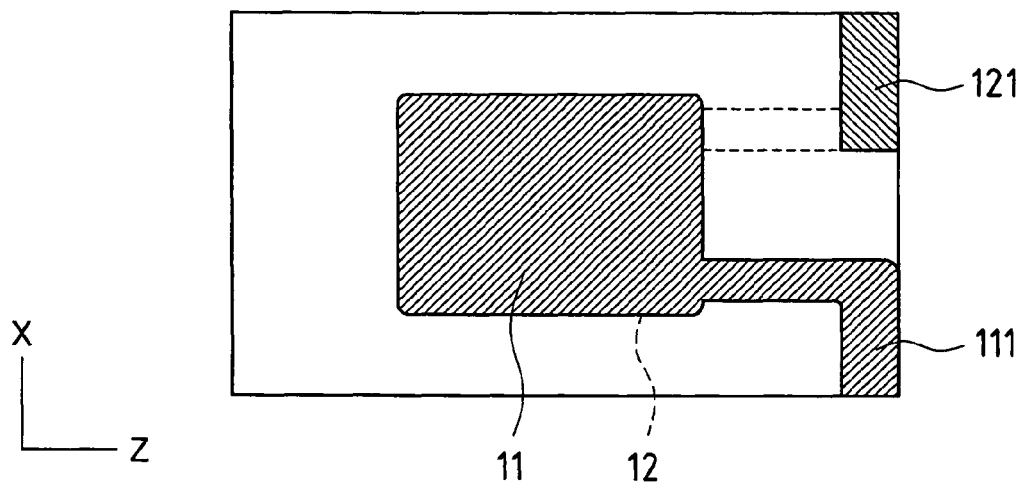
FIG. 19 is a schematic plan view of the crystal plate of the first embodiment of the present invention during a production process, where a cut-out has not yet been formed.
Figure 20:
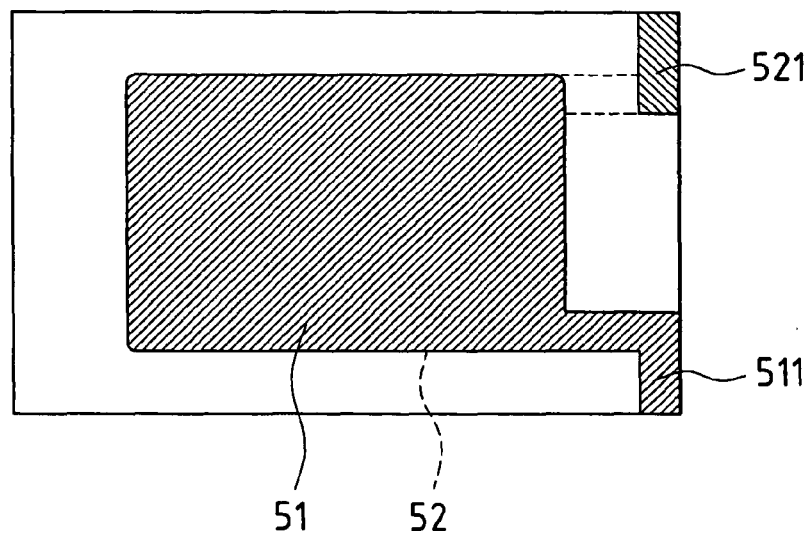
FIG. 20 is a schematic plan view of the crystal plate of the fifth embodiment of the present invention during a production process, where a cut-out has not yet been formed.
Figure 23:
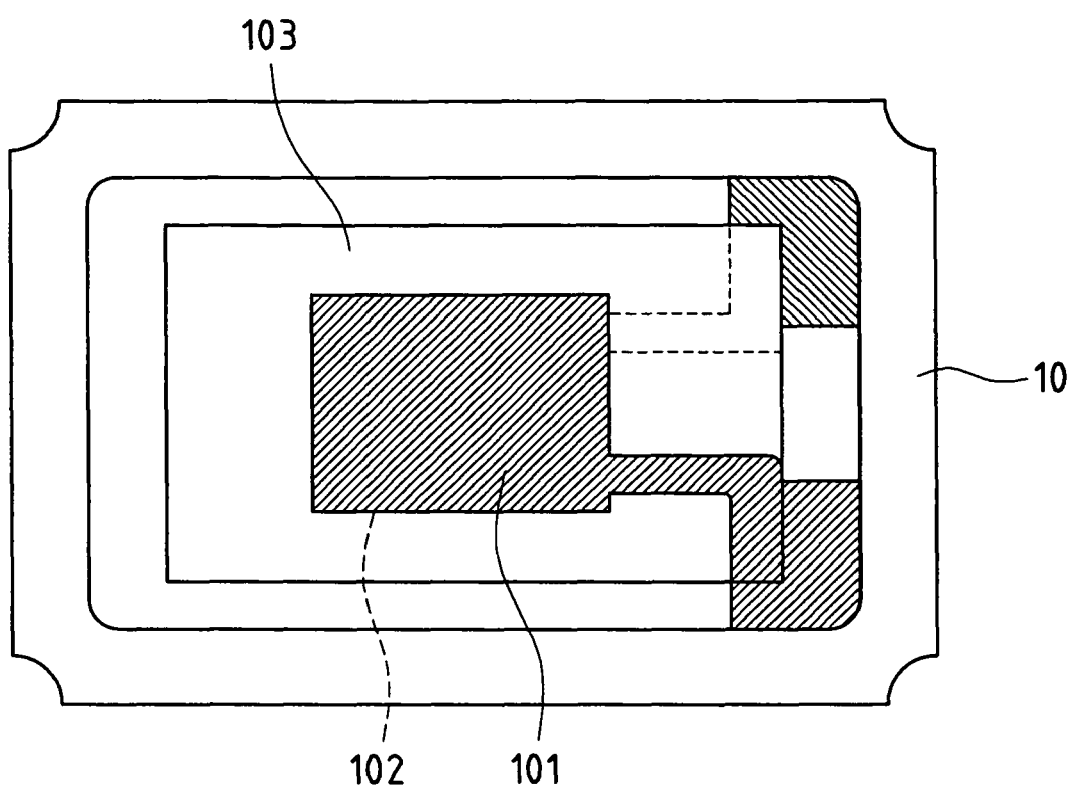
FIG. 23 is a schematic plan view showing an internal portion of a conventional crystal resonator.
Figure 24B:
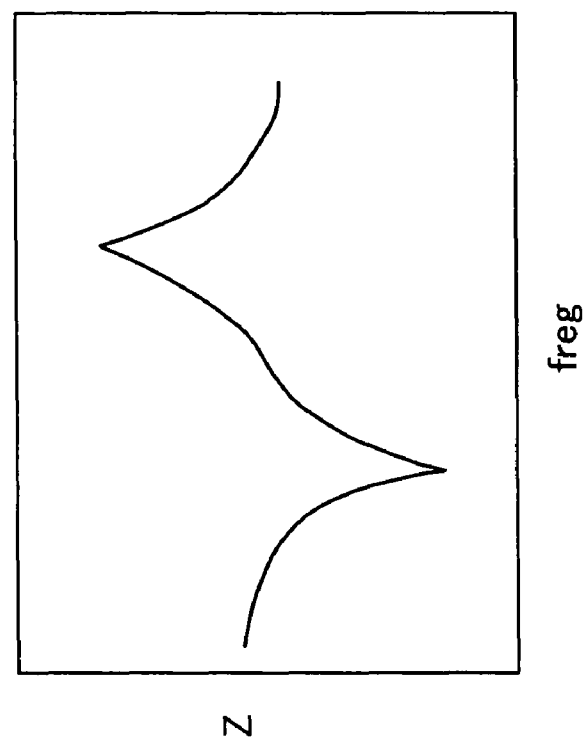
FIG. 24(b) is a graph showing frequency characteristics of the crystal vibrating element.
Figure 24A:
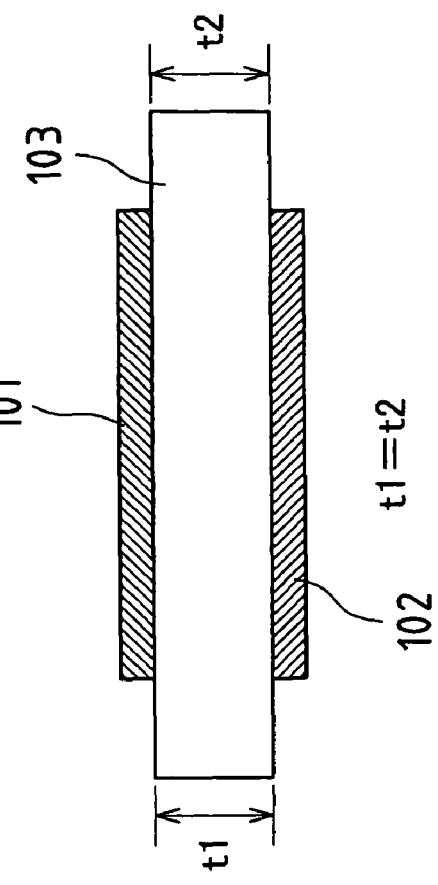
FIG. 24(a) is a schematic side view of the crystal vibrating element.
Figure 25A:
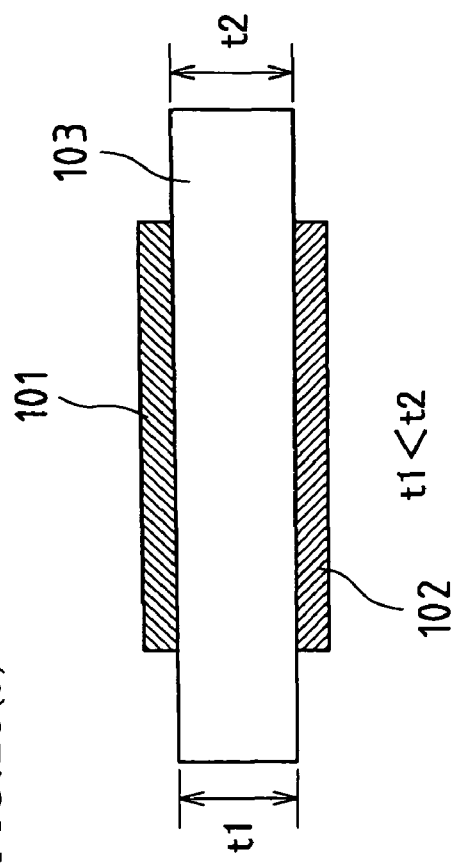
FIG. 25(a) is a schematic side view of the crystal vibrating element.
Figure 25B:
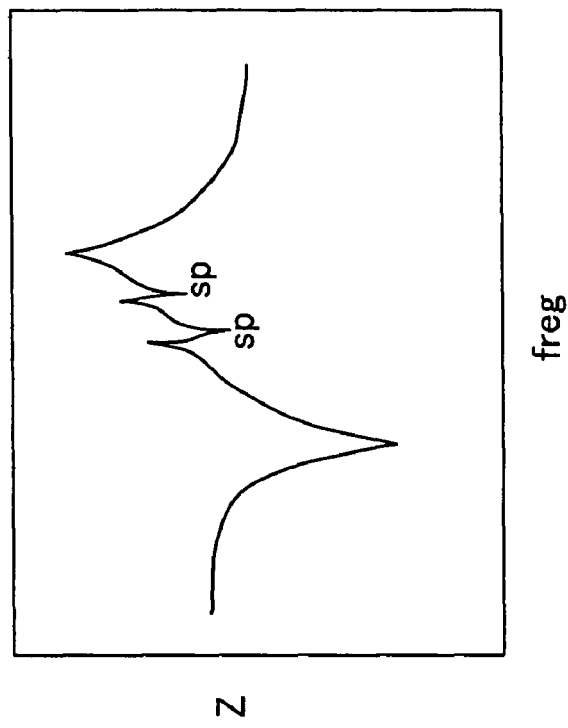
FIG. 25(b) is a graph showing frequency characteristics of the crystal vibrating element.
Figure 26A:
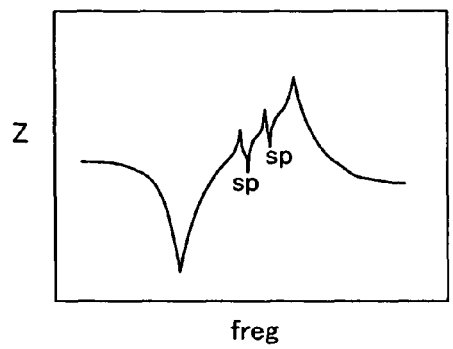
FIGS. 26(a) to 26(f) are graphs showing comparative data of the frequency characteristics of the crystal resonators as the samples of the demonstration data 1.
Figure 26B:
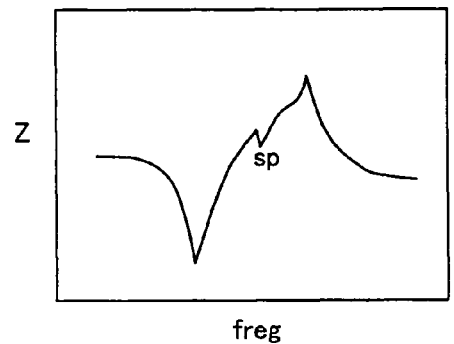
Figure 26C:
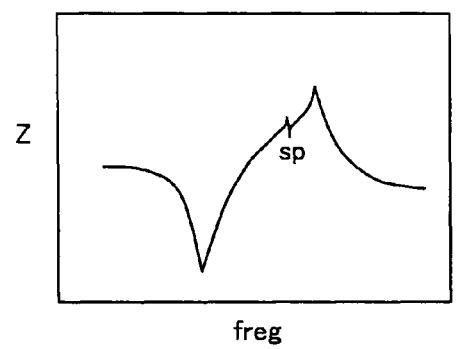
Figure 26D:
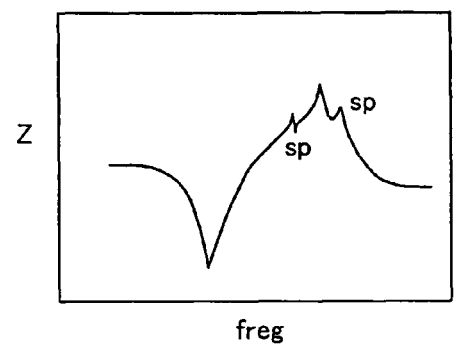
Figure 26E:
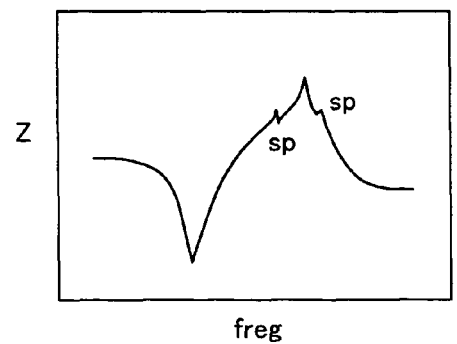
Figure 26F:
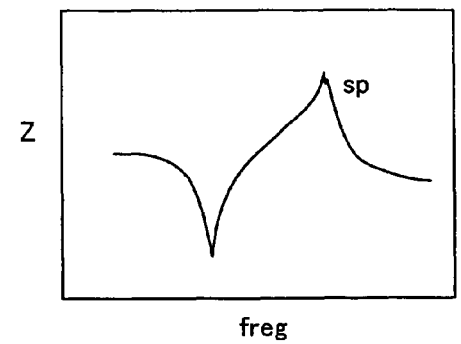

Note that the excitation electrodes of the above-described embodiments are shaped by photolithography. After the excitation electrodes are formed, cut-outs are formed by etching while finely adjusting frequencies. Specifically, in the case of the excitation electrodes 11 and 12 of FIG. 1 of Embodiment 1, after the excitation electrodes 11 and 12 of FIG. 19 are shaped, portions to be formed into cut-outs are removed by laser irradiation or milling adjustment to form mass adjustment portions that are the cut-outs 11a to 11d and 12a to 12d. In the case of the excitation electrodes 51 and 52 of FIGS. 7 and 8 of Embodiment 5, after the excitation electrode of FIG. 20 is shaped, portions to be formed into cut-outs are removed by laser irradiation or milling adjustment to form mass adjustment portions that are the cut-outs 51a to 51f and 52a to 52g. With this arrangement, frequency adjustment can be performed while observing a frequency waveform. Further, the lateral displacement balance of the crystal plate can be adjusted. As a result, secondary-mode spurious can be eliminated.

Note that the present invention is not limited to the above-described embodiments. For example, the crystal vibrating element may be is in the shape of a circle. The present invention can also be applied to a crystal vibrating element having other outer sizes and an excitation electrode having other outer sizes. The mass adjustment portion has been illustrated as a cut-out, and may be an additional mass arrangement that adds an electrode material or a resin. The present invention can also be applied to other frequencies. Particularly, in a crystal vibrating element of 100 MHz or more, a spurious vibration is likely to occur due to the fa mode. In this case, by applying the present invention, it is possible to obtain a crystal resonator having satisfactory characteristics without an influence of various spurious vibrations.

The cut-out that is a mass adjustment portion is not limited to an arrangement that exposes the crystal plate as in the embodiments above. Alternatively, the cut-out may be a mass adjustment portion that is a thin thickness portion having an electrode thickness smaller than that of other excitation electrode regions. Specifically, a typical excitation electrode comprises a multilayer film of metal materials. The thin thickness portion may be formed by reducing the layered arrangement only at a cut-out or a concave portion. In this embodiment as an example, a cut-out may be formed only in the chromium layer that is a bottom surface of the metal layer and may not be formed in the gold layer formed on the chromium layer. With such an arrangement in which a metal material is present in a cut-out or a concave portion, the metal material can be adjusted during typical frequency adjustment, resulting in effective adjustment of spurious suppression.

In the embodiments above, the cut-out is provided as a mass adjustment portion. The present invention is not limited to this. For mass adjustment, other arrangements that change the shape of the excitation electrode may be provided. For example, a cut portion (a portion where an electrode is not formed) that is a circular or polygonal through hole may be used.

Also, the present invention is not limited to the embodiments above. The present invention can also be applied to a crystal vibrating element having other outer sizes and an excitation electrode having other outer sizes. The present invention can also be applied to other frequencies. Particularly, in a crystal vibrating element of 100 MHz or more, a spurious vibration is likely to occur due to the fa mode. In this case, by applying the present invention, it is possible to obtain a crystal resonator having satisfactory characteristics without an influence of a spurious vibration.

Also, in the embodiment above, as a crystal vibrating element (crystal plate), an AT-cut crystal vibrating element in the shape of a plate (a rectangle as viewed from the top) is used. The shape is not limited to the embodiments above. As shown in FIGS. 21 and 22, concave portions may be formed on the front and rear surfaces, and excitation electrodes may be formed on base surfaces of the concave portions. Note that FIG. 21 shows a variation of Embodiment 1, and FIG. 22 shows a variation of Embodiment 5. The parts thereof have been described above and will not be here described.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

Note that this application claims priority on Patent Application No. 2005-267732 filed in Japan on Sep. 15, 2005, and Patent Application No. 2006-091885 filed in Japan on Mar. 29, 2006, the entire contents of which are hereby incorporated by reference.

INDUSTRIAL APPLICABILITY

The present invention is applicable for mass production of a crystal resonator.

The invention claimed is:

1. A crystal resonator comprising a crystal vibrating element that is driven by thickness-shear mode, wherein a pair of excitation electrodes is formed, facing a front surface and a rear surface of the crystal vibrating element, and each of the excitation electrodes is formed in the shape of a quadrangle as viewed from the top, and mass adjustment portions are formed at at least two directly opposite sides of each of the excitation electrodes formed on the front and rear surfaces.

2. The crystal resonator of claim 1, wherein each of the excitation electrodes is formed in the shape of a rectangle as viewed from the top, and a mass adjustment portion is formed in each of middle regions of at least two opposite sides of each of the excitation electrodes formed on the front and rear surfaces.

3. The crystal resonator of claim 1, wherein each of the excitation electrodes is formed in the shape of a rectangle as viewed from the top, and a mass adjustment portion is formed in a middle region of each side of each of the excitation electrodes formed on the front and rear surfaces.

4. The crystal resonator of claim 1, wherein each of the excitation electrodes is formed in the shape of a rectangle as viewed from the top, and a mass adjustment portion is formed in each of regions obtained by dividing at least two opposite sides of each of the excitation electrodes formed on the front and rear surfaces into three equal parts.

5. The crystal resonator of claim 4, wherein the two opposite sides are the longer sides.

6. The crystal resonator of claim 5, wherein at least one mass adjustment portion is formed at a shorter side of at least one of the excitation electrodes formed on the front and rear surfaces.

7. The crystal resonator of claim 1, wherein each of the excitation electrodes is formed in the shape of a rectangle as viewed from the top, and mass adjustment portions are formed at least two opposite sides of each of the excitation electrodes formed on the front and rear surfaces, a mass adjustment portion is formed in a middle region of each longer side of one of the excitation electrodes, mass adjustment portions are formed in regions shifted from a middle of each longer side toward both sides of the other excitation electrode, and the excitation electrodes have different shapes, and mass adjustment portions are formed between a middle region and both ends of a shorter side of each of the excitation electrodes.

8. The crystal resonator of claim 1, wherein a mass adjustment portion is a cut-out or a cut hole obtained by removing an excitation electrode, or a weight portion that weights an excitation electrode.

9. The crystal resonator of claim 8, wherein, regarding dimensions of the cut-out formed in the middle region of the excitation electrode, a ratio of an opening dimension to a dimension of a side of the excitation electrode at which the cut-out is formed is set to be from 0.15 to 0.40, and a ratio of a depth dimension to a dimension of a side adjacent to that side is set to be from 0.10 to 0.30.

10. The crystal resonator of claim 8, wherein, regarding dimensions of the cut-out formed in the region shifted from the middle toward both the sides of the excitation electrode, a ratio of an opening dimension to a dimension of a side of the excitation electrode at which the cut-out is formed is set to be from 0.06 to 0.20, and a ratio of a depth dimension to a dimension of a side adjacent to that side is set to be from 0.10 to 0.30.

11. The crystal resonator of claim 8, wherein the opening dimension of the cut-out is larger than the depth dimension of the cut-out.

12. The crystal resonator of claim 8, wherein an angular portion formed as a part of the cut-out are curved.

13. The crystal resonator of claim 8, wherein the opening dimension of the cut-out is larger than the base dimension of the cut-out.

14. The crystal resonator of claim 1, wherein electrode patterns of the excitation electrodes are different between the front and rear surfaces.

15. The crystal resonator of claim 9, wherein a fundamental vibration frequency is 100 MHz or more.

16. The crystal resonator of claim 2, wherein a mass adjustment portion is a cut-out or a cut hole obtained by removing an excitation electrode, or a weight portion that weights an excitation electrode.

17. The crystal resonator of claim 3, wherein a mass adjustment portion is a cut-out or a cut hole obtained by removing an excitation electrode, or a weight portion that weights an excitation electrode.

18. The crystal resonator of claim 4, wherein a mass adjustment portion is a cut-out or a cut hole obtained by removing an excitation electrode, or a weight portion that weights an excitation electrode.

19. The crystal resonator of claim 5, wherein a mass adjustment portion is a cut-out or a cut hole obtained by removing an excitation electrode, or a weight portion that weights an excitation electrode.

20. The crystal resonator of claim 6, wherein a mass adjustment portion is a cut-out or a cut hole obtained by removing an excitation electrode, or a weight portion that weights an excitation electrode.

* * * * *